(12) United States Patent
Hong et al.

(10) Patent No.: US 12,199,044 B2
(45) Date of Patent: Jan. 14, 2025

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Seunghui Hong, Hwaseong-si (KR); Sangwon Kim, Suwon-si (KR); Jeeyong Kim, Hanam-si (KR); Subin Shin, Suwon-si (KR); Habin Lim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 455 days.

(21) Appl. No.: 17/714,412

(22) Filed: Apr. 6, 2022

(65) Prior Publication Data

US 2023/0042792 A1 Feb. 9, 2023

(30) Foreign Application Priority Data

Aug. 6, 2021 (KR) .................. 10-2021-0103753

(51) Int. Cl.
*H10B 43/27* (2023.01)
*H01L 23/535* (2006.01)
*H10B 41/27* (2023.01)
*H10B 41/41* (2023.01)
*H10B 43/40* (2023.01)

(52) U.S. Cl.
CPC .......... *H01L 23/535* (2013.01); *H10B 41/27* (2023.02); *H10B 41/41* (2023.02); *H10B 43/27* (2023.02); *H10B 43/40* (2023.02)

(58) Field of Classification Search
CPC .............................. H10B 43/27; H10B 43/40
USPC ........................................................ 257/314
See application file for complete search history.

(56) References Cited

U.S. PATENT DOCUMENTS

| 10,014,309 B2 | 7/2018 | Dorhout et al. |
| 10,872,857 B1 | 12/2020 | Otsu et al. |
| 10,930,663 B2 | 2/2021 | Lu et al. |

(Continued)

FOREIGN PATENT DOCUMENTS

| KR | 10-2016-0136919 A | 11/2016 | |
| KR | 20210025032 A | * 3/2021 | ............. H10B 43/27 |

*Primary Examiner* — Phuc T Dang
(74) *Attorney, Agent, or Firm* — Harness, Dickey & Pierce, P.L.C.

(57) ABSTRACT

A peripheral circuit structure may include peripheral circuits and peripheral circuit lines on a semiconductor substrate, a semiconductor layer including cell array and connection regions on the peripheral circuit structure, a stack including electrodes stacked on the semiconductor layer having a stepwise structure on the connection region, and a planarization insulating layer covering the stack, vertical structures on the cell array region penetrating the stack, including a data storage pattern, a dam group including insulating dams on the connection region penetrating the stack, penetration plugs penetrating the insulating dams and connected to respective peripheral circuit lines, the dam group including a first insulating dam farthest from the cell array region, the first insulating dam including first and second sidewall portions spaced apart, a difference between upper and lower thicknesses of the second sidewall portion of the first insulating dam is larger than that of the first sidewall portion.

20 Claims, 31 Drawing Sheets

(56) References Cited

U.S. PATENT DOCUMENTS

| | | |
|---|---|---|
| 2016/0343727 A1 | 11/2016 | Kim et al. |
| 2020/0098782 A1 | 3/2020 | Nojima et al. |
| 2020/0273881 A1 | 8/2020 | Kim |
| 2021/0066313 A1 | 3/2021 | Park et al. |

* cited by examiner

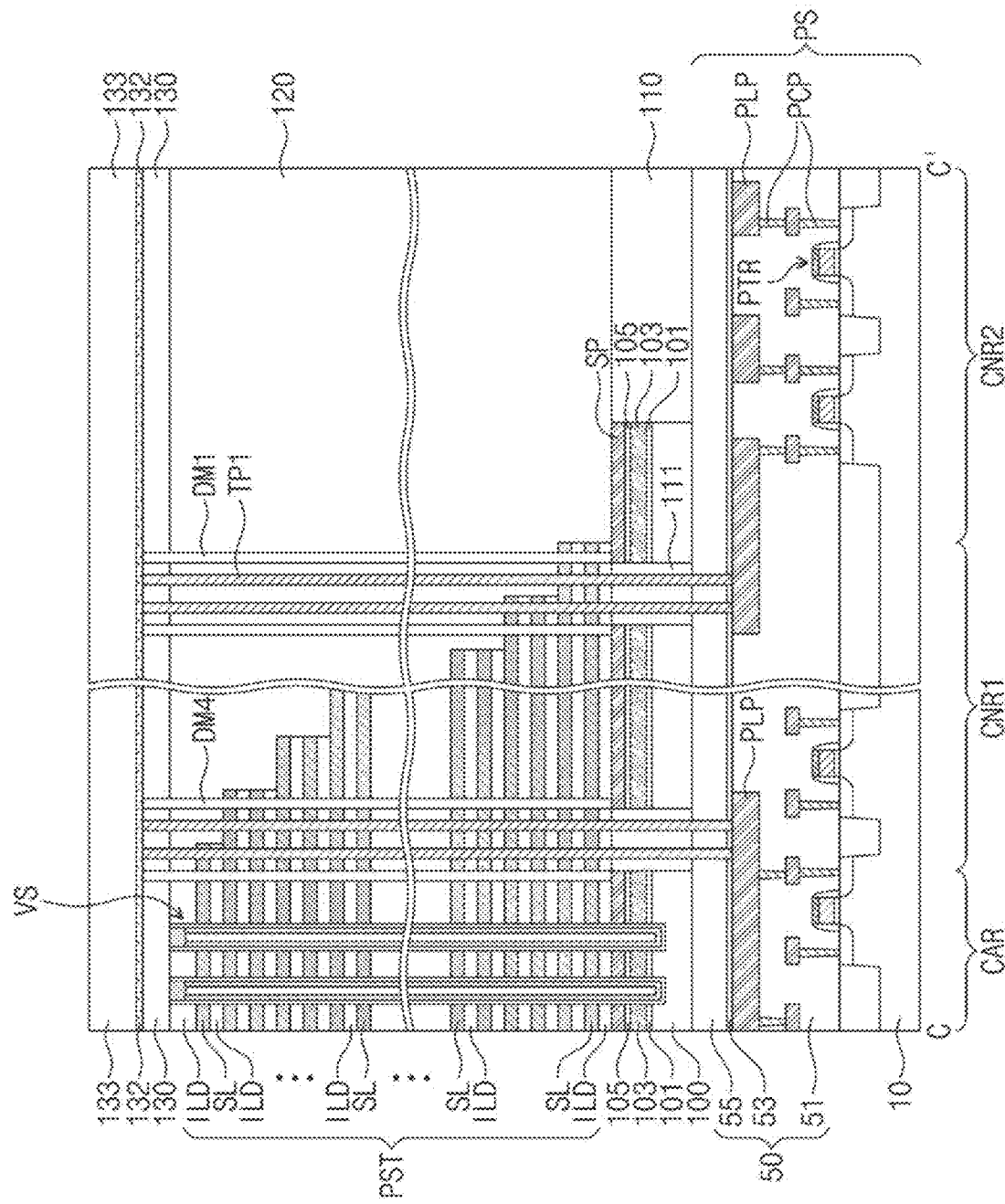

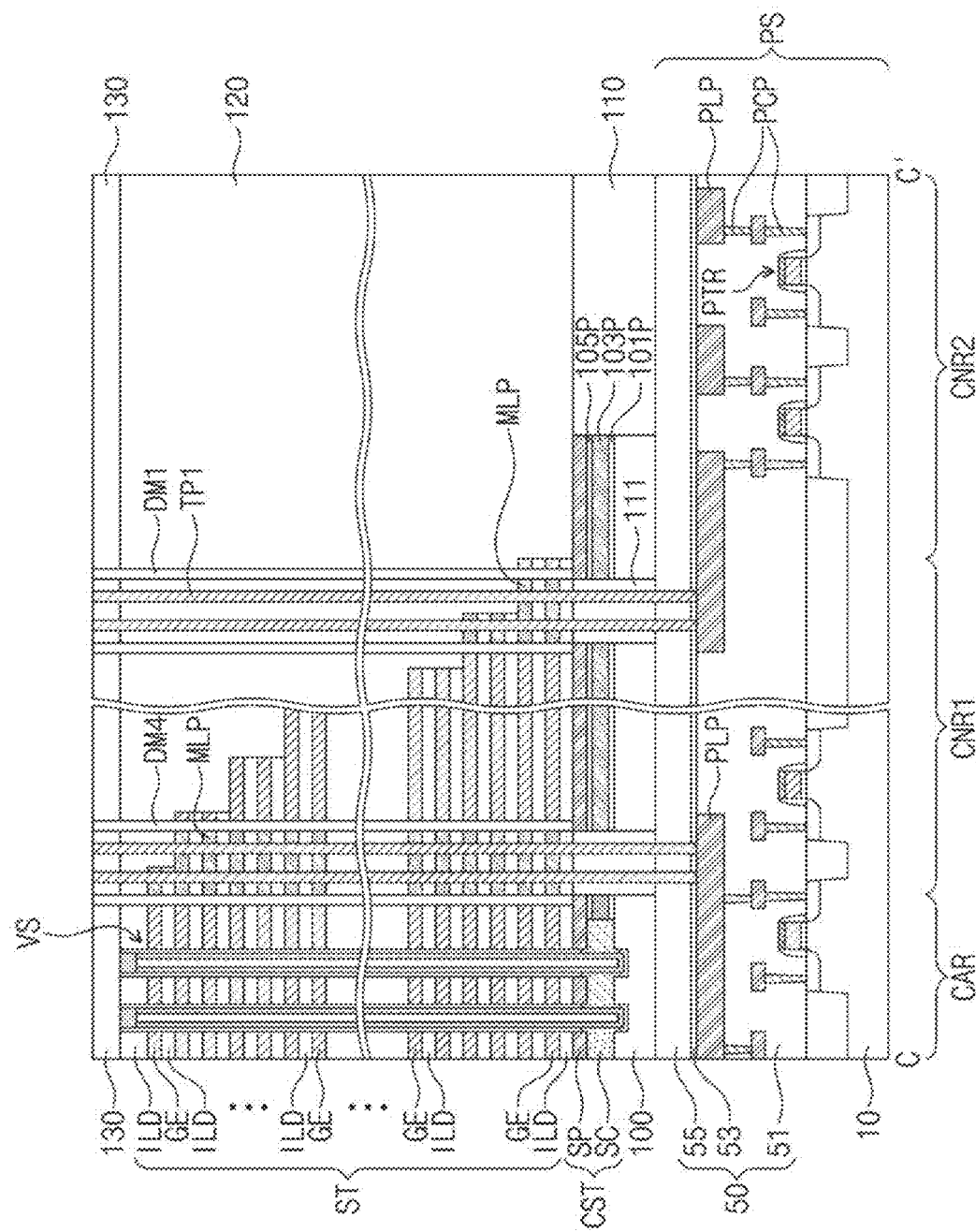

SEMICONDUCTOR DEVICE AND ELECTRONIC SYSTEM INCLUDING THE SAME

CROSS-REFERENCE TO RELATED APPLICATIONS

This U.S. non-provisional patent application claims priority under 35 U.S.C. § 119 to Korean Patent Application No. 10-2021-0103753, filed on Aug. 6, 2021, in the Korean Intellectual Property Office, the entire contents of which are hereby incorporated by reference.

BACKGROUND OF THE INVENTION

The present disclosure relates to semiconductor devices and electronic systems including the same.

A semiconductor device capable of storing a large amount of data is required as a part of an electronic system. Accordingly, many studies are being conducted to increase the data storage capacity of the semiconductor device. For example, semiconductor devices, in which memory cells are three-dimensionally arranged, are being suggested.

SUMMARY

Some example embodiments of the inventive concepts provide semiconductor devices with improved reliability and an increased integration density.

Some example embodiments of the inventive concepts provide electronic systems, which includes a semiconductor device with improved reliability and an increased integration density.

According to some example embodiments of the inventive concepts, a semiconductor device may include a peripheral circuit structure on a semiconductor substrate, the peripheral circuit structure including peripheral circuits and peripheral circuit lines, a semiconductor layer on the peripheral circuit structure, the semiconductor layer including a cell array region and a connection region, a stack including electrodes stacked on the semiconductor layer, and having a stepwise structure on the connection region, a planarization insulating layer covering the stack, vertical structures on the cell array region penetrating the stack, each of which includes a data storage pattern, separation structures extending in a first direction and penetrating the stack, cell contact plugs on the connection region penetrating the planarization insulating layer, and connected to respective ones of the electrodes, a dam group including insulating dams, which are provided on the connection region to penetrate the stack and are arranged in the first direction, and penetration plugs, which are provided to penetrate the insulating dams and are connected to the peripheral circuit lines, respectively. The dam group may include a first insulating dam, which is farthest from the cell array region. The first insulating dam may include a first sidewall portion and a second sidewall portion, which are spaced apart from each other in the first direction. A difference between an upper thickness and a lower thickness of the second sidewall portion of the first insulating dam may be larger than a difference between an upper thickness and a lower thickness of the first sidewall portion.

According to some example embodiments of the inventive concepts, a semiconductor device may include a peripheral circuit structure including peripheral circuits and peripheral circuit lines on a semiconductor substrate, a semiconductor layer on the peripheral circuit structure, the semiconductor layer including a cell array region and a connection region, a stack including electrodes stacked on the semiconductor layer, and having a stepwise structure on the connection region, a planarization insulating layer covering the stack, a source conductive pattern on the cell array region and between the substrate and the stack, dummy structures on the connection region penetrating the stack, a conductive support layer between the stack and the source conductive pattern, vertical structures on the cell array region penetrating the stack, and each of which includes a data storage pattern, separation structures extending in a first direction and penetrating the stack, cell contact plugs on the connection region penetrating the planarization insulating layer and connected to respective ones of the electrodes, a dam group including insulating dams arranged in the first direction on the connection region and penetrating the stack, and penetration penetrating the insulating dams and connected to respective ones of the peripheral circuit lines. The dam group may include a first insulating dam which is farthest from the cell array region. The first insulating dam may include a first sidewall portion and a second sidewall portion spaced apart from each other in the first direction. A difference between an upper thickness and a lower thickness of the second sidewall portion of the first insulating dam may be larger than a difference between an upper thickness and a lower thickness of the first sidewall portion.

According to some example embodiments of the inventive concepts, an electronic system may include a semiconductor device including a peripheral circuit structure, including peripheral circuits and peripheral circuit lines on a semiconductor substrate, a semiconductor layer on the peripheral circuit structure, the semiconductor layer including a cell array region and a connection region, a stack including electrodes stacked on the semiconductor layer, and having a stepwise structure on the connection region, a planarization insulating layer covering the stack, vertical structures on the cell array region penetrating the stack, each of which includes a data storage pattern, and separation structures extending in a first direction and penetrating the stack, cell contact plugs on the connection region penetrating the planarization insulating layer and connected to respective ones of the electrodes, a dam group including insulating dams arranged in the first direction on the connection region penetrating the stack, and penetration plugs penetrating the insulating dams and connected to respective ones of the peripheral circuit lines, and a controller electrically connected to the semiconductor device through the input/output pad to control the semiconductor device. The dam group may include a first insulating dam which is farthest from the cell array region. The first insulating dam may include a first sidewall portion and a second sidewall portion spaced apart from each other in the first direction. A difference between an upper thickness and a lower thickness of the second sidewall portion of the first insulating dam may be larger than a difference between an upper thickness and a lower thickness of the first sidewall portion.

BRIEF DESCRIPTION OF THE DRAWINGS

FIG. 6A is a sectional view taken along lines A-A' and B-B' of FIG. 5, and FIG. 6B is a sectional view taken along a line C-C' of FIG. 5.

FIGS. 7B, 8B, 9B, 10B, 11B, 12B, 13B, 14B, 15B, and 16B are sectional views which are taken along the line C-C' of FIG. 5 to illustrate a method of fabricating a semiconductor device according to some example embodiments of the inventive concept.

DETAILED DESCRIPTION

Example embodiments of the inventive concepts will now be described more fully with reference to the accompanying drawings, in which example embodiments are shown.

Figure 1:
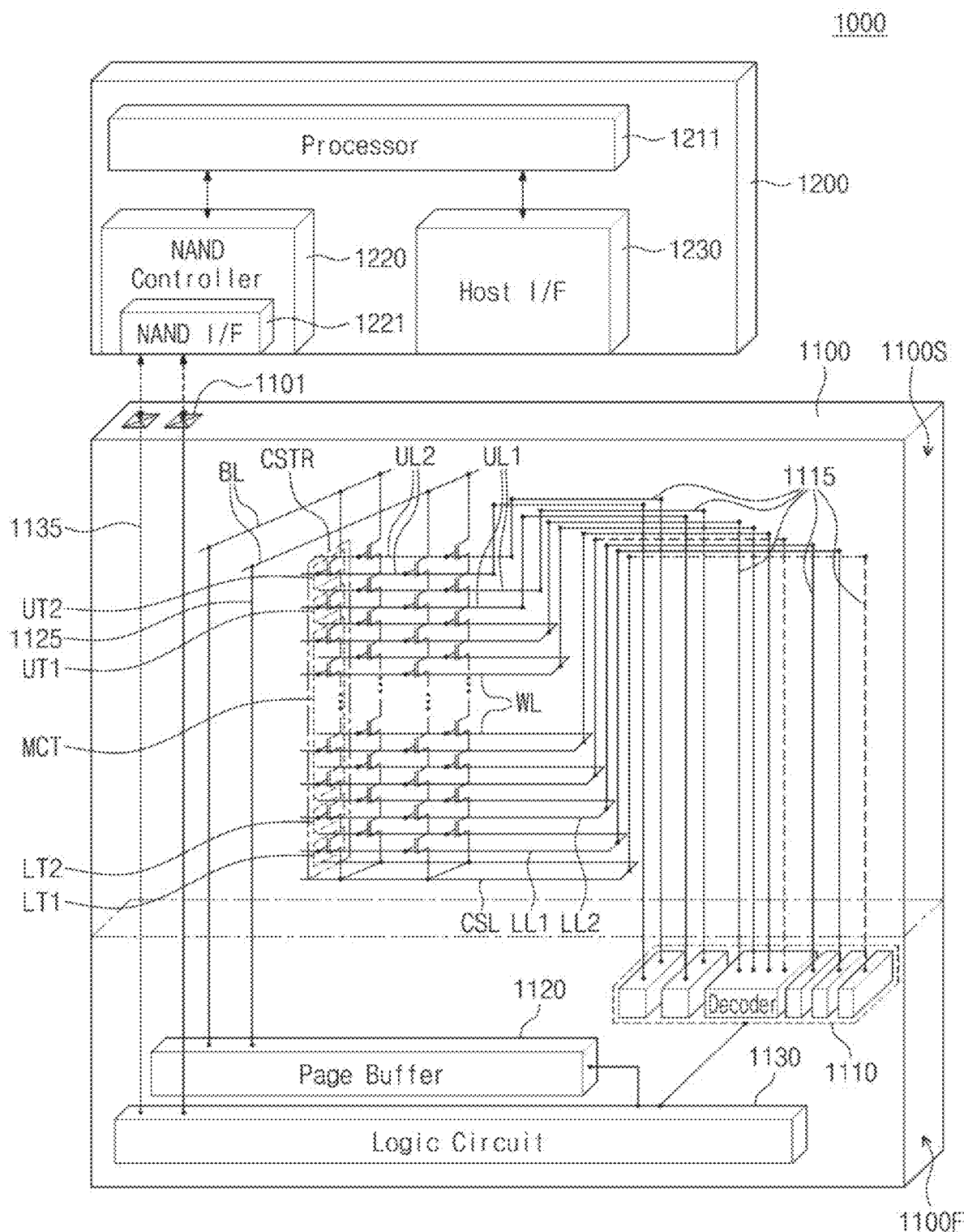
FIG. 1 is a diagram schematically illustrating an electronic system including a semiconductor device according to some example embodiments of the inventive concepts.

FIG. 1 is a diagram schematically illustrating an electronic system including a semiconductor device according to some example embodiments of the inventive concept.

Referring to FIG. 1, an electronic system 1000 according to some example embodiments of the inventive concepts may include a semiconductor device 1100 and a controller 1200 electrically connected to the semiconductor device 1100. The electronic system 1000 may be a storage device, which includes one or more semiconductor devices 1100, or an electronic device including the storage device. For example, the electronic system 1000 may be a solid state drive (SSD) device, a universal serial bus (USB), a computing system, a medical system, or a communication system, in which at least one semiconductor device 1100 is provided.

The semiconductor device 1100 may be a nonvolatile memory device (e.g., a NAND FLASH memory device). The semiconductor device 1100 may include a first structure 1100F and a second structure 1100S on the first structure 1100F. In some example embodiments, the first structure 1100F may be disposed beside the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed, according to some example embodiments.

In some example embodiments, at least one of the upper transistors UT1 and UT2 may include a string selection transistor, and at least one of the lower transistors LT1 and LT2 may include a ground selection transistor. The gate lower lines LL1 and LL2 may be used as gate electrodes of the lower transistors LT1 and LT2, respectively. The word lines WL may be used as gate electrodes of the memory cell transistors MCT, and the gate upper lines UL1 and UL2 may be used as gate electrodes of the upper transistors UT1 and UT2, respectively.

In some example embodiments, the lower transistors LT1 and LT2 may include a lower erase control transistor LT1 and a ground selection transistor LT2, which are connected in series. The upper transistors UT1 and UT2 may include a string selection transistor UT1 and an upper erase control transistor UT2, which are connected in series. At least one of the lower and upper erase control transistors LT1 and UT2 may be used for an erase operation of erasing data, which are stored in the memory cell transistors MCT, using a gate-induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection lines 1115, which are extended from the first structure 1100F to the second structure 1100S. The bit lines BL may be electrically connected to the page buffer 1120 through second connection lines 1125, which are extended from the first structure 1100F to the second structure 1100S.

In the first structure 1100F, the decoder circuit 1110 and the page buffer 1120 may be configured to perform a control operation on at least selected one of the memory cell transistors MCT. The decoder circuit 1110 and the page buffer 1120 may be controlled by the logic circuit 1130. The semiconductor device 1100 may communicate with the controller 1200 through an input/output pad 1101, which is electrically connected to the logic circuit 1130. The input/output pad 1101 may be electrically connected to the logic circuit 1130 through an input/output connection line 1135, which is extended from the first structure 1100F to the second structure 1100S.

The controller 1200 may include a processor 1211, a NAND controller 1220, and a host interface 1230. In some example embodiments, the electronic system 1000 may include a plurality of semiconductor devices 1100, and in this case, the semiconductor devices 1100 may be controlled by the controller 1200.

The processor 1211 may be configured to control overall operations of the electronic system 1000 including the controller 1200. The processor 1211 may be operated depending on a specific firmware and may control the NAND controller 1220 to access the semiconductor device 1100. The NAND controller 1220 may include a NAND interface 1221 which is used for communication with the semiconductor device 1100. The NAND interface 1221 may be used to transmit control commands, which are used to control the semiconductor device 1100, and data, which will be written in or read from the memory cell transistors MCT of the semiconductor device 1100. The host interface 1230 may be configured to allow for communication between the electronic system 1000 and an external host. When the control command is received from the external host through the host interface 1230, the processor 1211 may control the semiconductor device 1100 in response to the control command.

The electronic system 1000 (or other circuitry, for example, the semiconductor device 1100, controller 1200, decoder circuit 1110, page buffer 1120, logic circuit 1130, processor 1211, NAND controller 1220, host interface 1230, or other circuitry discussed herein) may include hardware including logic circuits; a hardware/software combination such as a processor executing software: or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Figure 2:
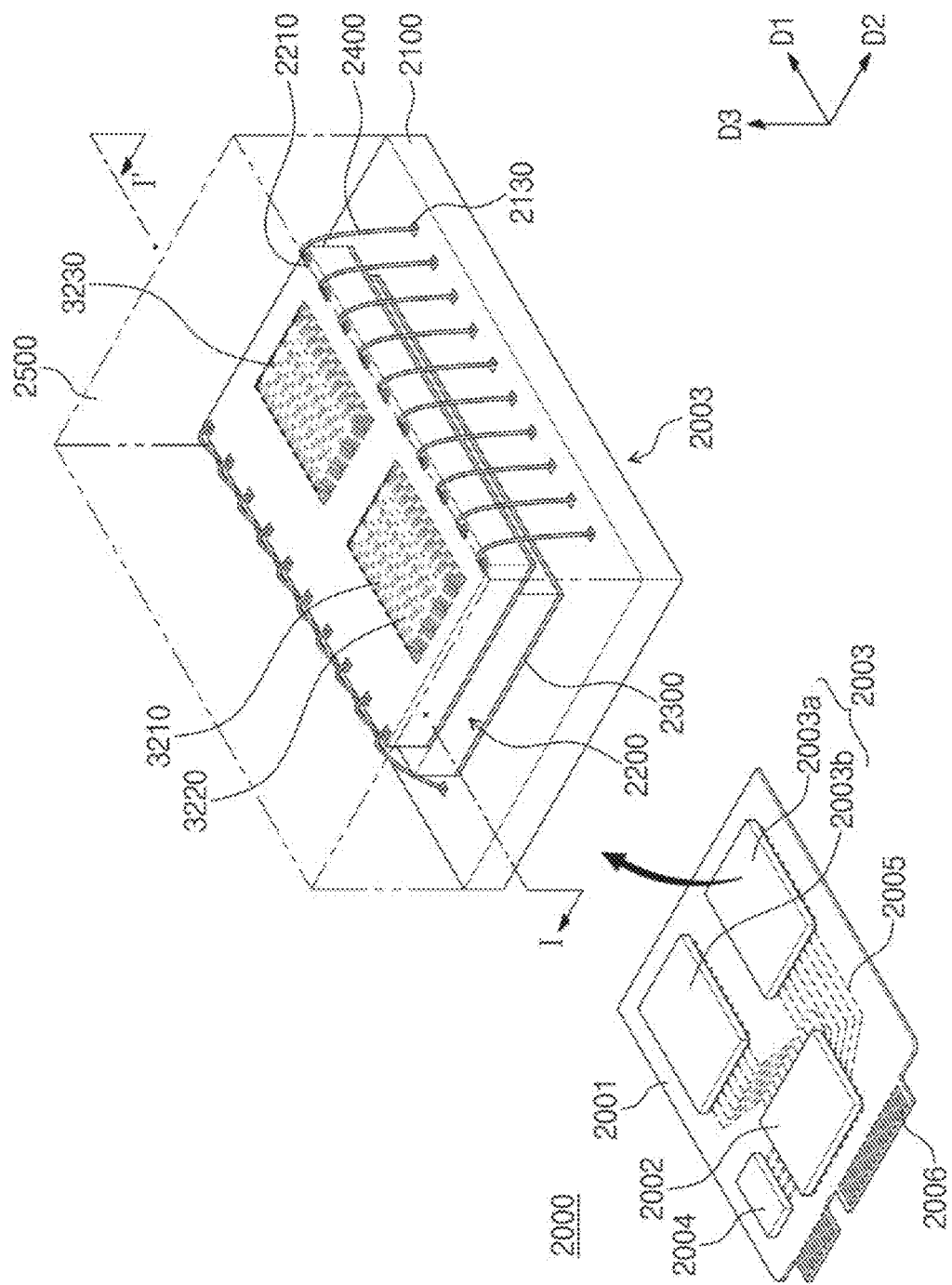
FIG. 2 is a perspective view schematically illustrating an electronic system including a semiconductor device, according to some example embodiments of the inventive concept.

FIG. 2 is a perspective view schematically illustrating an electronic system including a semiconductor device, according to some example embodiments of the inventive concept.

Referring to FIG. 2, an electronic system 2000 according to some example embodiments of the inventive concepts may include a main substrate 2001 and a controller 2002, at least one semiconductor package 2003, and a DRAM 2004, which are mounted on the main substrate 2001. The semiconductor package 2003 and the DRAM 2004 may be connected to the controller 2002 and to each other by interconnection patterns 2005, which are formed in the main substrate 2001.

The main substrate 2001 may include a connector 2006, which includes a plurality of pins coupled to an external host. In the connector 2006, the number and arrangement of the pins may be changed depending on a communication interface between the electronic system 2000 and the external host. In some example embodiments, the electronic system 2000 may communicate with the external host, in accordance with one of interfaces, such as universal serial bus (USB), peripheral component interconnect express (PCI-Express), serial advanced technology attachment (SATA), universal flash storage (UFS) M-Phy, or the like. In some example embodiments, the electronic system 2000 may be driven by an electric power, which is supplied from the external host through the connector 2006. The electronic system 2000 may further include a power management integrated circuit (PMIC) that is configured to separately supply an electric power, which is provided from the external host, to the controller 2002 and the semiconductor package 2003.

The controller 2002 may be configured to control a writing or reading operation on the semiconductor package 2003 and to improve an operation speed of the electronic system 2000.

The DRAM 2004 may be a buffer memory that is configured to relieve technical difficulties caused by a difference in speed between the semiconductor package 2003, which serves as a data storage device, and an external host. In some example embodiments, the DRAM 2004 in the electronic system 2000 may serve as a cache memory and may be used as a storage space, which is used to temporarily store data during a control operation on the semiconductor package 2003. In the case where the electronic system 2000 includes the DRAM 2004, the controller 2002 may further include a DRAM controller for controlling the DRAM 2004, in addition to a NAND controller for controlling the semiconductor package 2003.

The semiconductor package 2003 may include first and second semiconductor packages 2003a and 2003b, which are spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on respective bottom surfaces of the semiconductor chips 2200, a connection structure 2400 electrically connecting the semiconductor chips 2200 to the package substrate 2100, and a molding layer 2500 disposed on the package substrate 2100 to cover the semiconductor chips 2200 and the connection structure 2400.

The package substrate 2100 may be a printed circuit board including package upper pads 2130. Each of the semiconductor chips 2200 may include an input/output pad 2210. The input/output pad 2210 may correspond to the input/output pad 1101 of FIG. 1. Each of the semiconductor chips 2200 may include gate stacks 3210 and vertical structures 3220. Each of the semiconductor chips 2200 may include a semiconductor device according to some example embodiments of the inventive concepts, which will be described below.

In some example embodiments, the connection structure 2400 may be a bonding wire electrically connecting the input/output pad 2210 to the package upper pad 2130. Thus, in each of the first and second semiconductor packages 2003a and 2003b, the semiconductor chips 2200 may be electrically connected to each other in a bonding wire manner and may be electrically connected to the package upper pads 2130 of the package substrate 2100. In some example embodiments, the semiconductor chips 2200 in each of the first and second semiconductor packages 2003a and 2003b may be electrically connected to each other by a connection structure including through silicon vias (TSVs), not by the connection structure 2400 provided in the form of bonding wires.

In some example embodiments, the controller 2002 and the semiconductor chips 2200 may be included in a single package. In some example embodiments, the controller 2002 and the semiconductor chips 2200 may be mounted on a separate interposer substrate, which is prepared independent of the main substrate 2001, and may be connected to each other through interconnection lines, which are provided in the interposer substrate.

Figure 3:
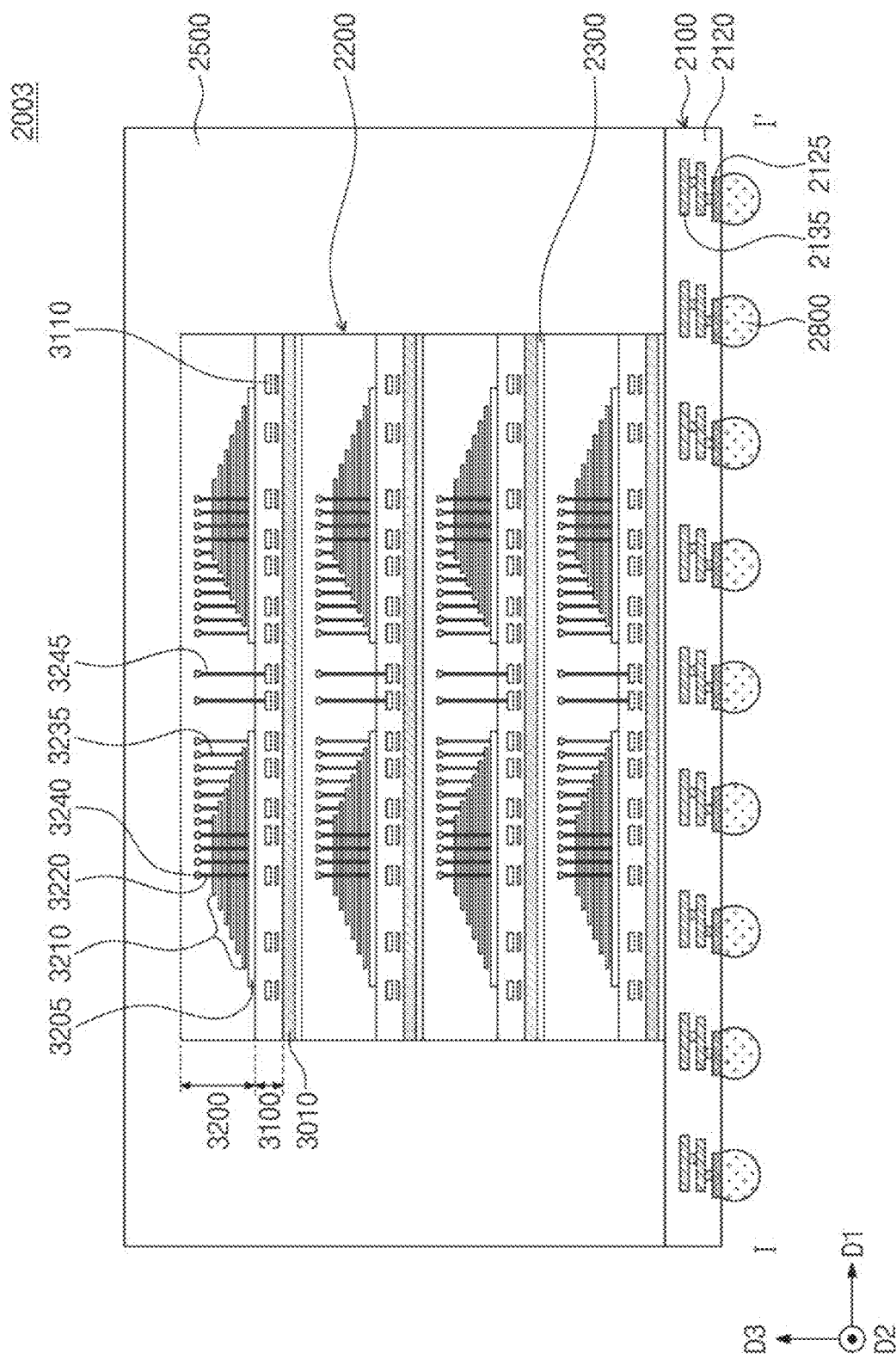
FIGS. 3 and 4 are sectional views, each of which schematically illustrates a semiconductor package according to some example embodiments of the inventive concept.
Figure 4:
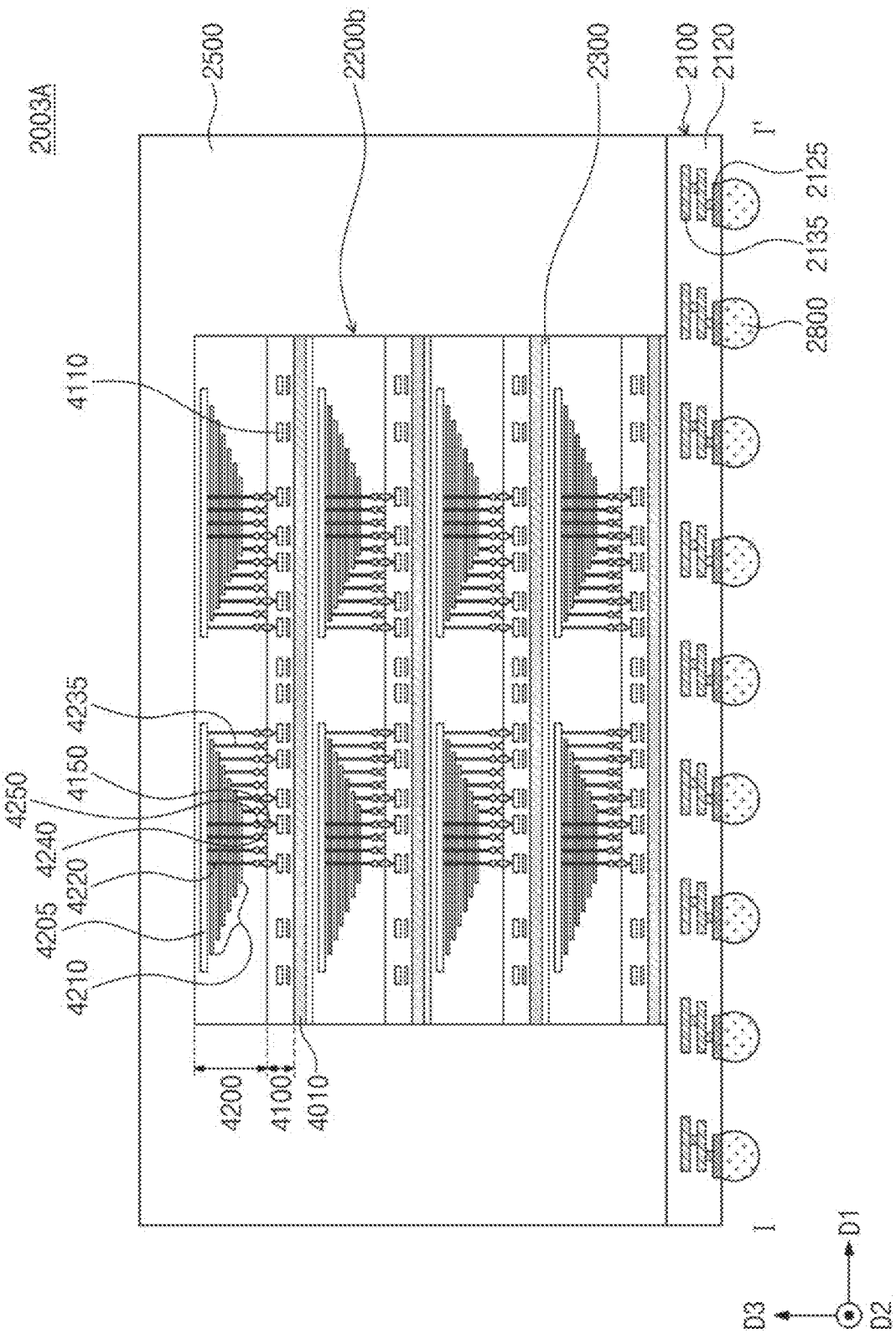

FIGS. 3 and 4 are sectional views, each of which schematically illustrates a semiconductor package according to some example embodiments of the inventive concept. FIGS. 3 and 4 conceptually illustrate two different examples of the semiconductor package of FIG. 2 and are, for example, sectional views taken along a line I-I' of FIG. 2.

Referring to FIG. 3, in the semiconductor package 2003, the package substrate 2100 may be a printed circuit board. The package substrate 2100 may include a package substrate body portion 2120, the package upper pads 2130 (e.g., of FIG. 2) disposed on a top surface of the package substrate body portion 2120, lower pads 2125, which are disposed on or exposed through a bottom surface of the package substrate body portion 2120, and internal lines 2135, which are provided in the package substrate body portion 2120 to electrically connect the package upper pads 2130 to the lower pads 2125. The package upper pads 2130 may be electrically connected to the connection structures 2400. The lower pads 2125 may be connected to the interconnection patterns 2005, which are provided in a main substrate 2001 of the electronic system 2000, through conductive connecting portions 2800, as shown in FIG. 2.

Each of the semiconductor chips 2200 may include a semiconductor substrate 3010 and first and second structures 3100 and 3200, which are sequentially stacked on the semiconductor substrate 3010. The first structure 3100 may include a peripheral circuit region, in which peripheral lines 3110 are provided. The second structure 3200 may include a source structure 3205, the stack 3210 on the source structure 3205, the vertical structures 3220 and separation structures 3230 (e.g., see FIG. 2) penetrating the stack 3210, bit lines 3240 electrically connected to the vertical structures 3220, and cell contact plugs 3235 electrically connected to the word lines WL (e.g., of FIG. 1) of the stack 3210. Each of the first and second structures 3100 and 3200 and the semiconductor chips 2200 may further include separation structures to be described below.

Each of the semiconductor chips 2200 may include penetration lines 3245, which are electrically connected to the peripheral lines 3110 of the first structure 3100 and are extended into the second structure 3200. The penetration line 3245 may be disposed outside the stack 3210 or may be disposed to penetrate the stack 3210. Each of the semiconductor chips 2200 may further include the input/output pads 2210 (e.g., of FIG. 2), which are electrically connected to the peripheral lines 3110 of the first structure 3100.

Referring to FIG. 4, in the semiconductor package 2003A, each of the semiconductor chips 2200a may include a semiconductor substrate 4010, a first structure 4100 on the semiconductor substrate 4010, and a second structure 4200, which is provided on the first structure 4100 and is bonded with the first structure 4100 in a wafer bonding manner.

The first structure 4100 may include a peripheral circuit region, in which a peripheral line 4110 and first junction structures 4150 are provided. The second structure 4200 may include a source structure 4205, a stack 4210 between the first structure 4100 and the source structure 4205, vertical structures 4220 and a separation structure penetrating the stack 4210, and second junction structures 4250, which are electrically and respectively connected to the vertical structures 4220 and the word lines WL (e.g., see FIG. 1) of the stack 4210. For example, the second junction structures 4250 may be electrically connected to the vertical structures 4220 and the word lines WL (e.g., see FIG. 1A), respectively, through bit lines 4240 electrically connected to the vertical structures 4220 and cell contact plugs 4235 electrically connected to the word lines WL (e.g., see FIG. 1A). The first junction structures 4150 of the first structure 4100 may be in contact with and coupled to the second junction structures 4250 of the second structure 4200. The coupled portions of the first and second junction structures 4150 and 4250 may be formed of or include, for example, copper (Cu). Each of the semiconductor chips 2200b may include the input/output pad 2210 (e.g., see FIG. 2), which are electrically connected to the peripheral lines 4110 of the first structure 4100.

The semiconductor chips 2200 of FIG. 3 and the semiconductor chips 2200b of FIG. 4 may be electrically connected to each other by the connection structures 2400, which are provided in the form of bonding wires. However, in some example embodiments, a plurality of semiconductor chips (e.g., 2200 of FIGS. 3 and 2200b of FIG. 4), which are provided in each semiconductor package, may be electrically connected to each other by a connection structure (e.g., through-silicon vias (TSVs)).

The first structure 3100 of FIG. 3 and the first structure 4100 of FIG. 4 may correspond to a peripheral circuit structure in some example embodiments to be described below, and the second structure 3200 of FIG. 3 and the second structure 4200 of FIG. 4 may correspond to a cell array structure in some example embodiments to be described below.

Figure 5:
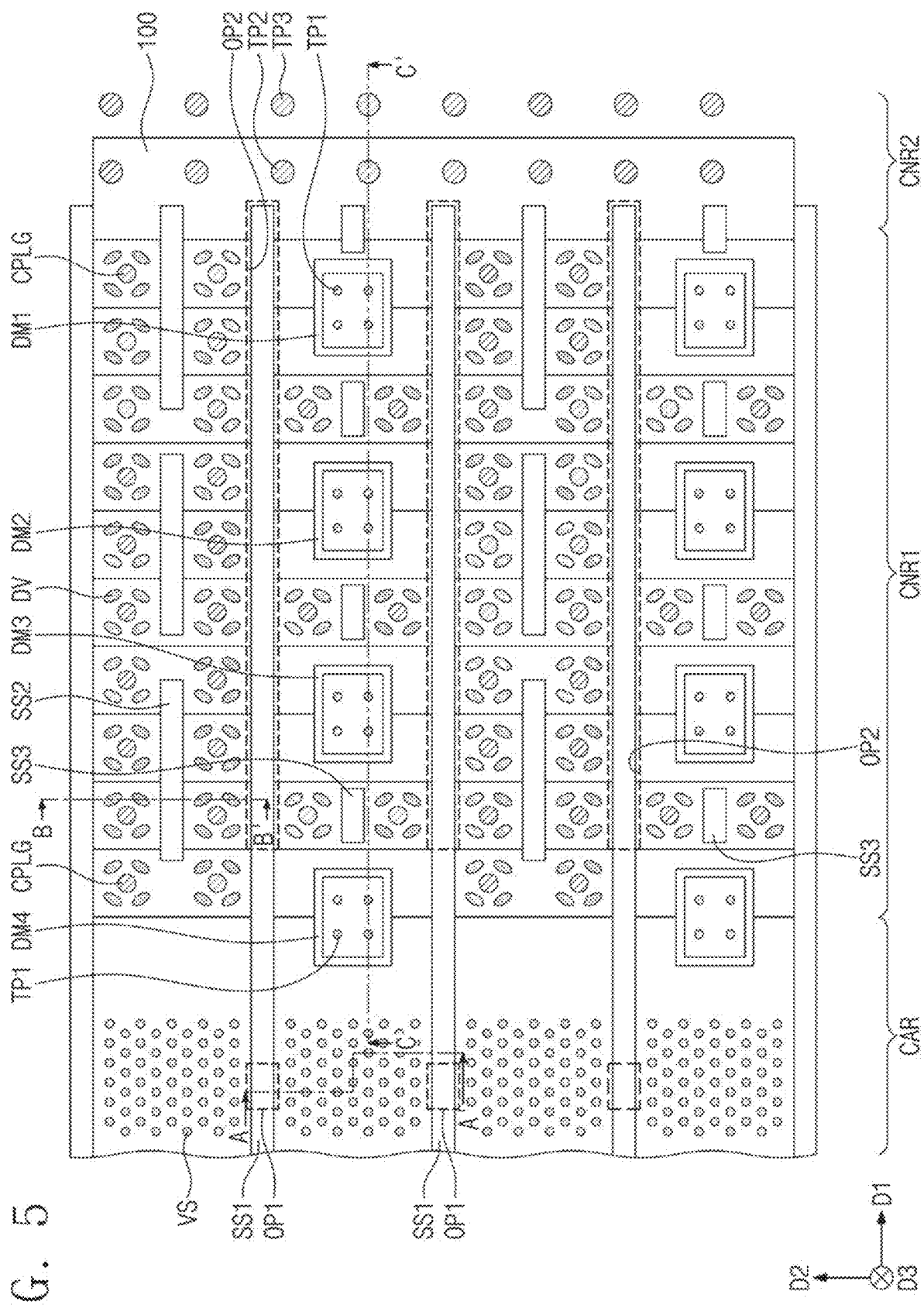
FIG. 5 is a plan view illustrating a semiconductor device according to some example embodiments of the inventive concept.
Figure 6A:
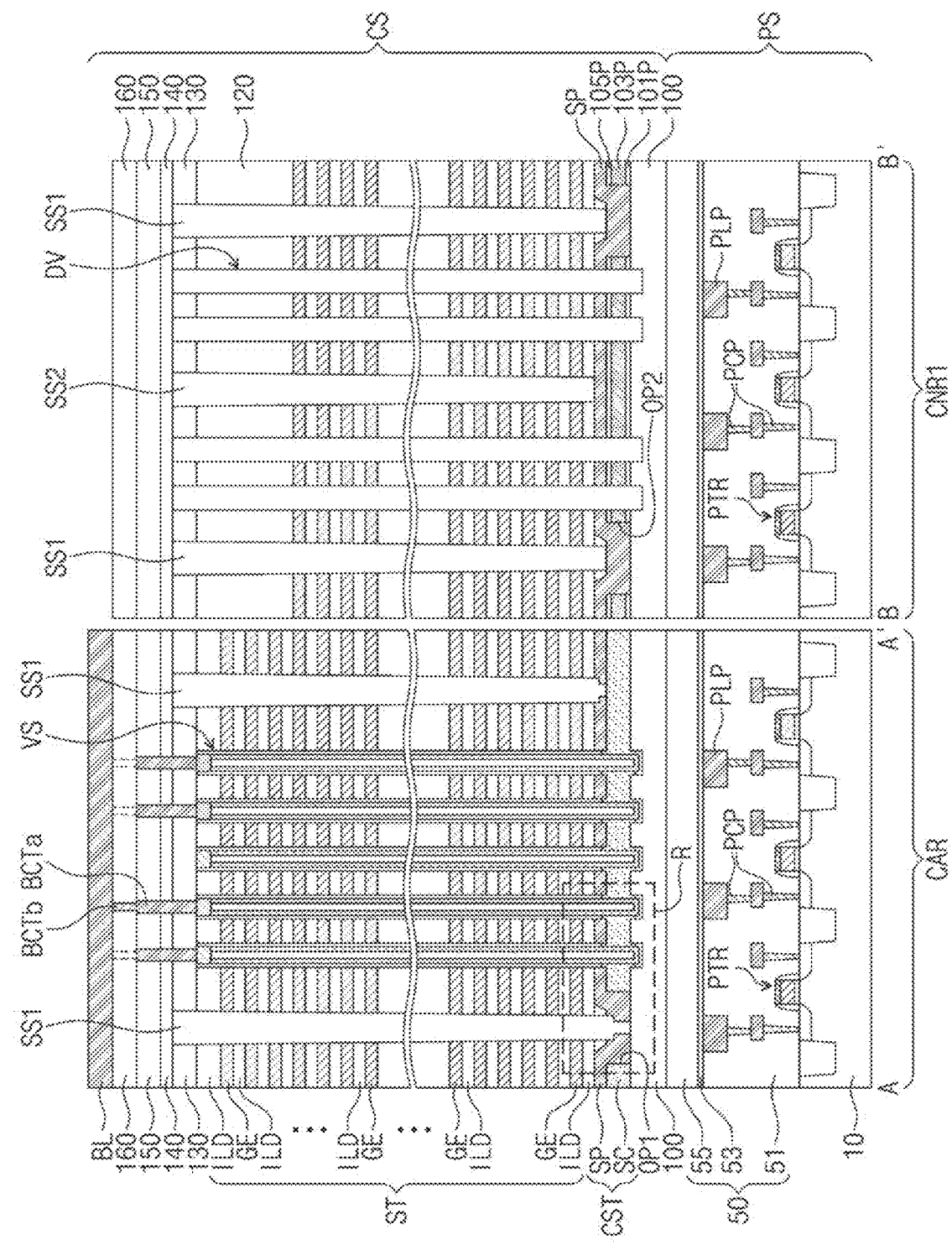
FIGS. 6A and 6B are sectional views illustrating a semiconductor device according to some example embodiments of the inventive concepts.
Figure 6B:
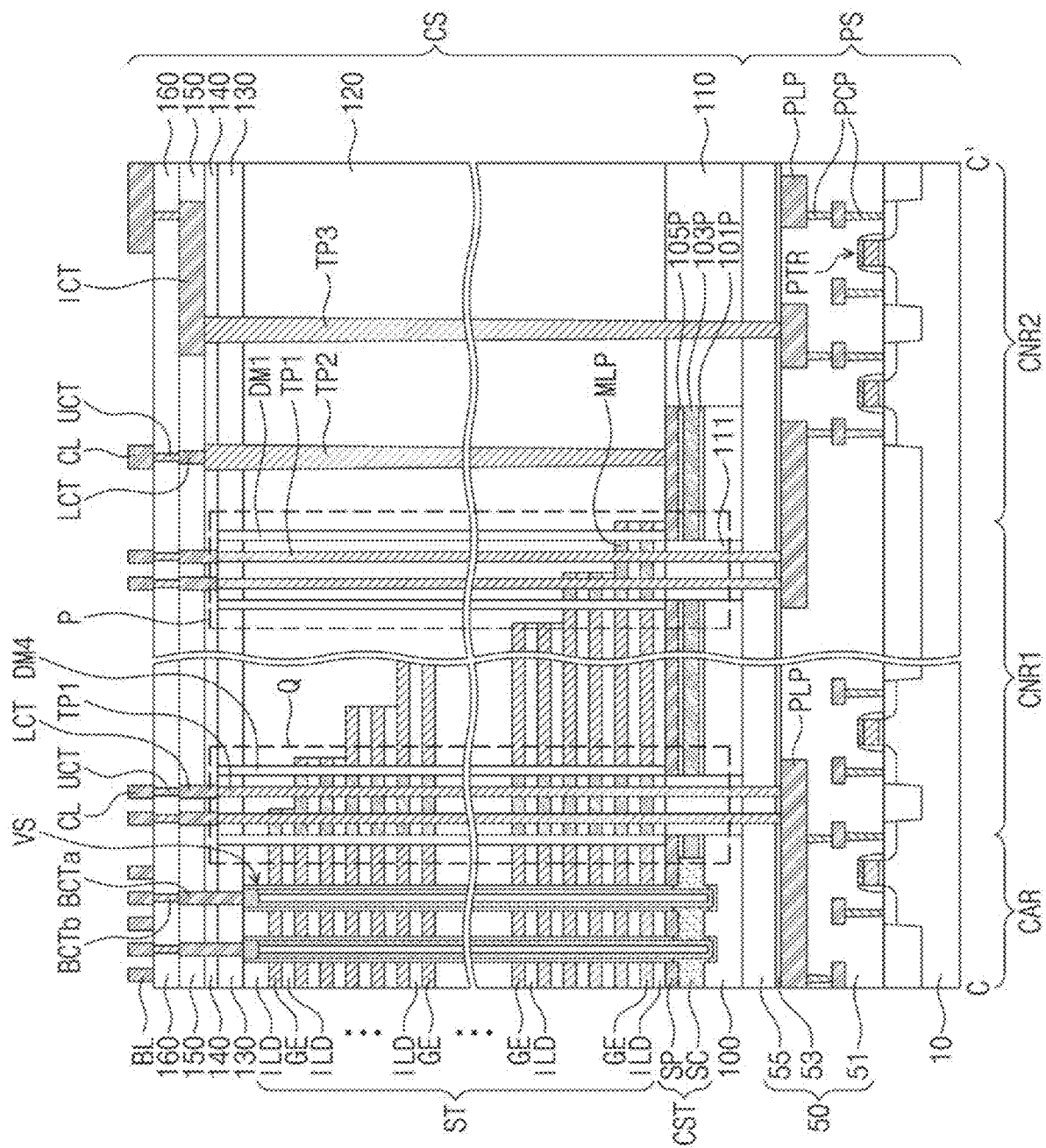
Figure 6C:
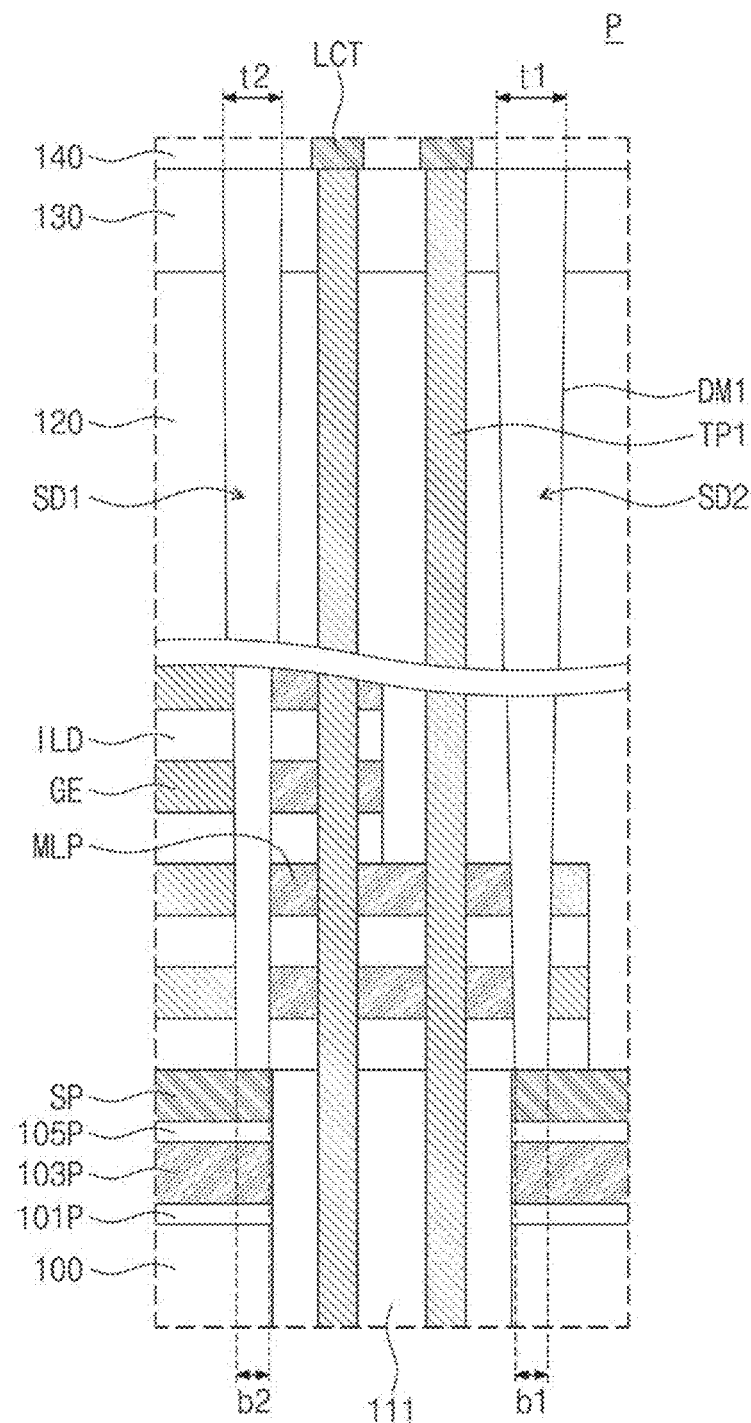
FIG. 6C is an enlarged sectional view of a portion 'P' of FIG. 6B.
Figure 6D:
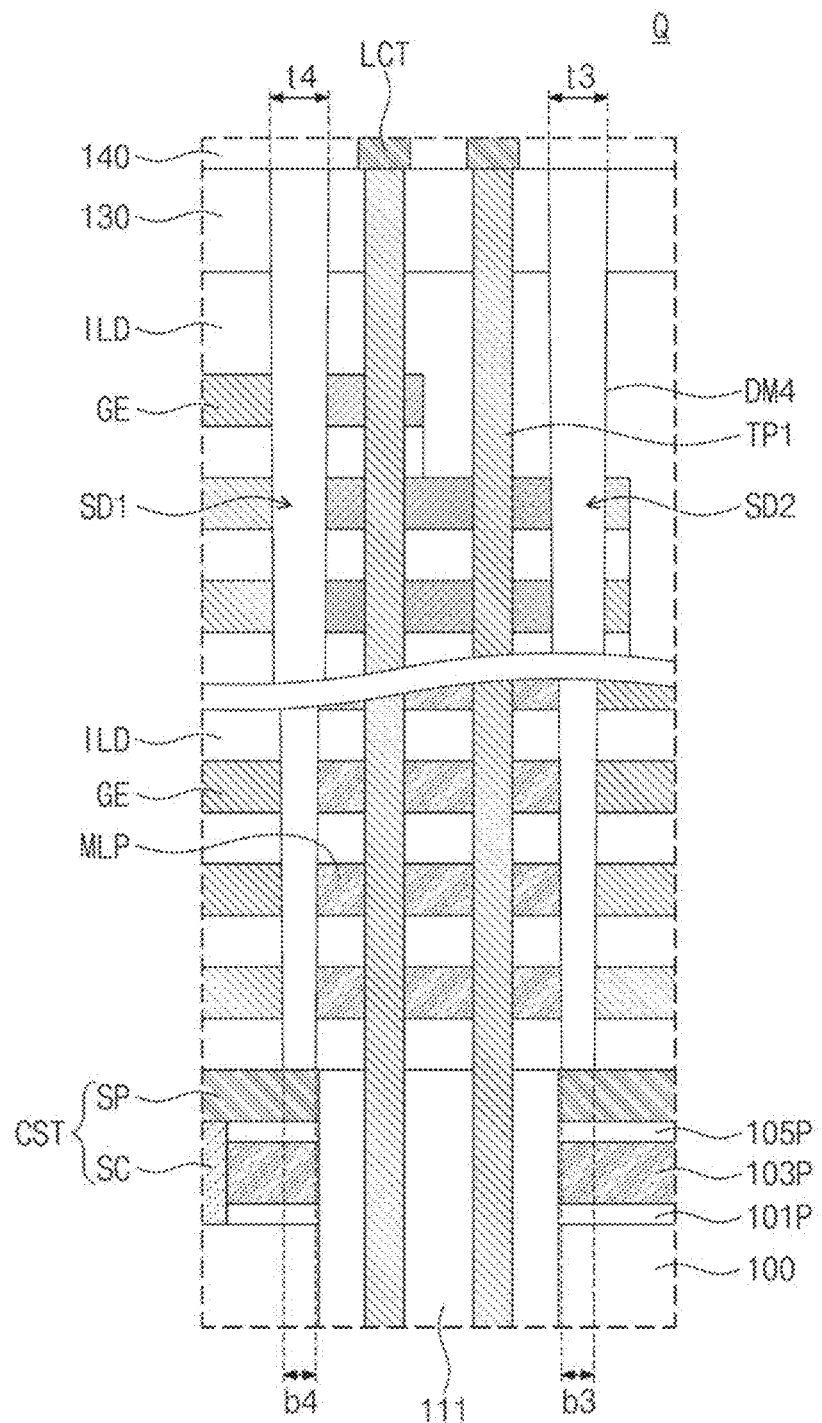
FIG. 6D is an enlarged sectional view of a portion 'Q' of FIG. 6B.
Figure 6E:
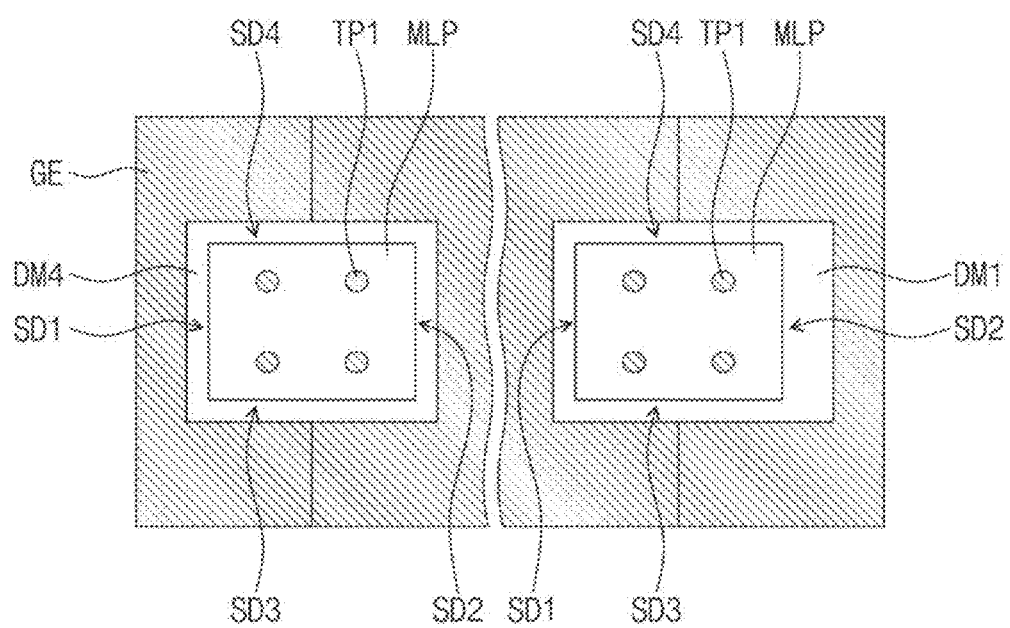
FIG. 6E is a plan view illustrating insulating dams according to some example embodiments of the inventive concept.
Figure 6F:
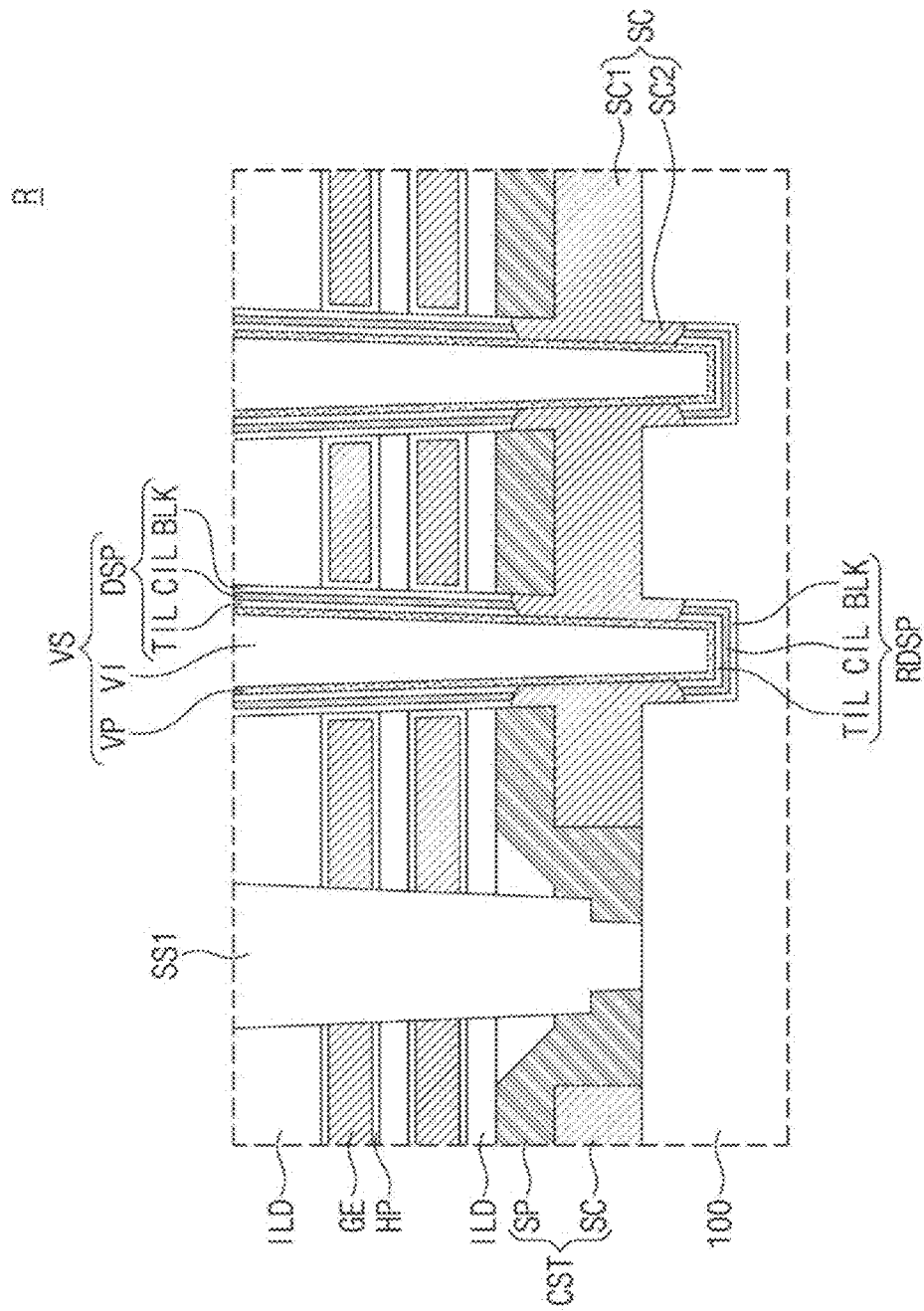
FIG. 6F is an enlarged sectional view of a portion 'R' of FIG. 6A.

FIG. 5 is a plan view illustrating a semiconductor device according to some example embodiments of the inventive concept. FIGS. 6A and 6B are sectional views illustrating a semiconductor device according to some example embodiments of the inventive concepts, FIG. 6A is a sectional view taken along lines A-A' and B-B' of FIG. 5, and FIG. 6B is a sectional view taken along a line C-C' of FIG. 5. FIG. 6C is an enlarged sectional view of a portion 'P' of FIG. 6B. FIG. 6D is an enlarged sectional view of a portion 'Q' of FIG. 6B. FIG. 6E is a plan view illustrating insulating dams according to some example embodiments of the inventive concept. FIG. 6F is an enlarged sectional view of a portion 'R' of FIG. 6A.

Referring to FIGS. 5 and 6A to 6F, a semiconductor device according to some example embodiments of the inventive concepts may include a peripheral circuit structure PS and a cell array structure CS on the peripheral circuit structure PS.

The peripheral circuit structure PS may include peripheral circuits PTR, which are integrated on a semiconductor substrate 10, and a lower insulating layer 50, which is provided to cover the peripheral circuits PTR. The semiconductor substrate 10 may include a cell array region CAR and first and second connection regions CNR1 and CNR2, and here, the first connection region CNR1 may be located between the cell array region CAR and the second connection region CNR2 in a first direction D1. The first connection region CNR1 may be a portion of the semiconductor substrate 10, on which a stepwise portion of a stack ST is provided. The second connection region CNR2 may be a portion of the semiconductor substrate 10, which is not covered with the stack ST.

The semiconductor substrate 10 may be a silicon substrate. For convenience in illustration, the first and second connection regions CNR1 and CNR2 are illustrated to be provided at a side of the cell array region CAR, but in some example embodiments, the first and second connection regions CNR1 and CNR2 and other elements to be described below may be provided at an opposite side of the cell array region CAR.

The peripheral circuits PTR may include row and column decoders, a page buffer, a control circuit, and so forth. In more detail, the peripheral circuits PTR may include NMOS and PMOS transistors. Peripheral circuit lines PLP may be electrically connected to the peripheral circuits PTR through peripheral contact plugs PCP.

The lower insulating layer 50 may be provided on the semiconductor substrate 10. The lower insulating layer 50 may be provided on the semiconductor substrate 10 to cover the peripheral circuits PTR, the peripheral contact plugs PCP, and the peripheral circuit lines PLP. The peripheral contact plugs PCP and the peripheral circuit lines PLP may be electrically connected to the peripheral circuits PTR.

The lower insulating layer 50 may include a plurality of vertically-stacked insulating layers. For example, the lower insulating layer 50 may include a silicon oxide layer, a silicon nitride layer, a silicon oxynitride layer, and/or a low-k dielectric layer. In some example embodiments, the lower insulating layer 50 may include a first lower insulating layer 51, a second lower insulating layer 55, and an etch stop layer 53 between the first and second lower insulating layers 51 and 55. The etch stop layer 53 may be formed of or include an insulating material different from the first and second lower insulating layers 51 and 55 and may cover the top surfaces of the uppermost ones of the peripheral circuit lines PLP.

The cell array structure CS may be disposed on the lower insulating layer 50. The cell array structure CS may include a semiconductor layer 100, a source structure CST, dummy insulating patterns 101p, 103p, and 105p, the stack ST, vertical structures VS, dummy structures DV, cell contact plugs CPLG, penetration plugs TP1, TP2, and TP3, bit lines BL, and conductive lines CL. In some example embodiments, the cell strings CSTR of FIG. 1 may be integrated on the semiconductor layer 100. The stack ST and the vertical structures VS may constitute the cell strings CSTR shown in FIG. 1.

In more detail, the semiconductor layer 100 may be disposed on a top surface of the lower insulating layer 50. The semiconductor layer 100 may be formed of or include at least one of semiconductor materials, insulating materials, or conductive materials. The semiconductor layer 100 may be formed of or include a doped semiconductor material of the first conductivity type (e.g., n-type) and/or an undoped or intrinsic semiconductor material. The semiconductor layer 100 may have one of single-crystalline, amorphous, and polycrystalline structures.

The source structure CST may include a source conductive pattern SC and a conductive support layer SP on the source conductive pattern SC. The source structure CST may be parallel to a top surface of the semiconductor layer 100 and may be extended parallel to the stack ST and in the first direction D1, in the cell array region CAR.

In the cell array region CAR, the source conductive pattern SC may be disposed between the semiconductor layer 100 and the stack ST. The source conductive pattern SC may have first openings OP1 in the cell array region CAR. The first openings OP1 may be spaced apart from each other and may have a circle or bar shape. The source conductive pattern SC may be formed of or include a semiconductor material that is doped with dopants (e.g., phosphorus (P) or arsenic (As)) to have a first conductivity type. For example, the source conductive pattern SC may be formed of a poly-silicon layer that is doped with n-type dopants.

In some example embodiments, the dummy insulating patterns 101p, 103p, and 105p may be disposed in the first connection region CNR1 and between the semiconductor layer 100 and the stack ST. The dummy insulating patterns 101p, 103p, and 105p may be located at the same or substantially the same level as the source conductive pattern SC.

The dummy insulating patterns 101p, 103p, and 105p may have second openings OP2 in the first connection region CNR1. The second openings OP2 may be spaced apart from each other and may be shaped like a bar or line. For example, the second openings OP2 may be a line-shaped empty space that is extended in the first direction D1, and a length of the second openings OP2 in the first direction D1 may vary depending on their positions.

The dummy insulating patterns 101p, 103p, and 105p may include a first insulating pattern 101p, a second insulating pattern 103p, and a third insulating pattern 105p, which are sequentially stacked. The second insulating pattern 103p may be formed of or include an insulating material that is different from the first and second insulating patterns 101p and 105p. The second insulating pattern 103p may be thicker than the first and second insulating patterns 101p and 105p. Each of the first insulating pattern 101p, the second insulating pattern 103p, and the third insulating pattern 105p may be formed of or include at least one of silicon oxide, silicon nitride, silicon oxynitride, silicon carbide, or silicon germanium.

The conductive support layer SP may cover a top surface of the source conductive pattern SC in the cell array region CAR and may cover top surfaces of the dummy insulating patterns 101p, 103p, and 105p in the first connection region CNR1. The conductive support layer SP may be formed of or include a doped semiconductor material (e.g., of a first conductivity type or an n-type) and/or an undoped or intrinsic semiconductor material.

In the cell array region CAR, portions of the conductive support layer SP may be provided to penetrate the source conductive pattern SC and to be in contact with the semiconductor layer 100. In the first connection region CNR1, portions of the conductive support layer SP may be provided to penetrate the dummy insulating patterns 101p, 103p, and 105p and to be in contact with the semiconductor layer 100. In other words, the conductive support layer SP may include first portions, which are provided to fill the first openings OP1 of the source conductive pattern SC, and second portions, which are provided to fill the second openings OP2 of the dummy insulating patterns 101p, 103p, and 105p. The conductive support layer SP may be provided to cover a side surface of the source conductive pattern SC in the first openings OP1 and to cover side surfaces of the dummy insulating patterns 101p, 103p, and 105p in the second openings OP2. In each of the first and second openings OP1 and OP2, the conductive support layer SP may have a recessed top surface.

A buried insulating pattern 110 may be disposed to cover a side surface of the semiconductor layer 100 and a side surface of the source structure CST, on the second connection region CNR2. The buried insulating pattern 110 may be in contact with the lower insulating layer 50 and may have a top surface that is substantially coplanar with a top surface of the source structure CST.

An insulating penetration pattern 111 may be provided on the first connection region CNR1 to penetrate the source structure CST and the semiconductor layer 100. The insulating penetration pattern 111 may be in contact with the lower insulating layer 50 and may have a top surface that is substantially coplanar with the top surface of the source structure CST.

The stack ST may be disposed on the source structure CST. The stack ST may be extended from the cell array region CAR to the first connection region CNR1 in the first direction D1 and may have a stepwise structure on the first connection region CNR1.

The stack ST may include electrodes GE and insulating layers ILD, which are alternately stacked in a third direction D3 (i.e., a vertical direction), and here, the third direction D3 may be perpendicular to first and second directions D1 and D2 crossing each other. The electrodes GE may be formed of or include at least one of, for example, doped semiconductor materials (e.g., doped silicon), metallic materials (e.g., tungsten, copper, and aluminum), conductive metal nitrides (e.g., titanium nitride and tantalum nitride), or transition metals (e.g., titanium and tantalum). The insulating layers ILD may include a silicon oxide layer and/or a low-k dielectric layer. In some example embodiments, the semiconductor device may be a vertical-type NAND FLASH memory device, and in this case, the electrodes GE of the stack ST may be used as the gate lower lines LL1 and LL2, the word lines WL, and the gate upper lines UL1 and UL2 described with reference to FIG. 1.

Each of the electrodes GE may include a pad portion provided on the first connection region CNR1. As an example, among of the electrodes GE of the stack ST, the pad portions of even- or odd-numbered electrodes GE may be disposed in the first direction D1, and the cell contact plugs CPLG may be respectively coupled to the pad portions of the even-numbered electrodes GE. As another example, among the electrodes GE of the stack ST, the pad portions of the 4n-th electrodes GE may be disposed in the first direction D1, where n is a positive integer. The side surfaces of the (4n−1)-th, (4n−2)-th, and (4n−3)-th electrodes GE may be aligned to the side surface of the 4n-th electrode GE. The cell contact plugs CPLG may be coupled to the pad portions of the 4n-th electrodes GE. As other example, the pad portions of the electrodes GE may be located at positions that are different from each other in both of horizontal and vertical directions.

Referring to FIG. 6F, a horizontal insulating pattern HP may be provided to conformally cover side surfaces of the electrodes GE, which are adjacent to the vertical structures VS, and top and bottom surfaces of each of the electrodes GE. The horizontal insulating pattern HP may be formed of or include at least one of high-k dielectric materials (e.g., aluminum oxide and hafnium oxide).

A planarization insulating layer 120 may cover the pad portions of the stack ST provided in the stepwise structure. The planarization insulating layer 120 may have a substantially flat top surface. The planarization insulating layer 120 may include a single insulating layer or a plurality of stacked insulating layers. First to fourth interlayer insulating layers 130, 140, 150, and 160 may be sequentially provided on the planarization insulating layer 120.

The vertical structures VS may be provided on the cell array region CAR to penetrate the stack ST and the source structure CST. When viewed in a plan view, the vertical structures VS may be arranged in a linear or zigzag manner. Each of the vertical structures VS may include a lower vertical structure and an upper vertical structure, which are respectively provided to penetrate a lower portion and an upper portion of the stack ST.

Referring to FIG. 6F, each of the vertical structures VS may include a vertical semiconductor pattern VP and a data storage pattern DSP, which is provided to enclose a side surface of the vertical semiconductor pattern VP. In detail, the vertical semiconductor pattern VP may have a pipe or macaroni shape with closed bottom. The vertical semiconductor pattern VP may be provided to have a 'U'-shaped section and an inner space of vertical semiconductor pattern VP may be filled with a gap-filling insulating pattern VI. The vertical semiconductor pattern VP may be formed of or include at least one of semiconductor materials (e.g., silicon (Si), germanium (Ge), or compounds thereof). The vertical semiconductor pattern VP, which includes a semiconductor material, may be used as channel regions of the upper transistors UT1 and UT2, the memory cell transistors MCT, and the lower transistors LT1 and LT2 described with reference to FIG. 1. A bottom surface of the vertical semiconductor pattern VP may be located at a level lower than a bottom surface of the source conductive pattern SC.

A portion of the side surface of the vertical semiconductor pattern VP may be in contact with the source conductive pattern SC. In more detail, the source conductive pattern SC may include a horizontal portion SC1, which is provided between the conductive support layer SP and the semiconductor layer 100 to be parallel to the stack ST, and a sidewall portion SC2, which is provided to be in contact with a portion of the side surface of the vertical semiconductor pattern VP and to enclose the vertical semiconductor pattern VP. In the source conductive pattern SC, a top surface of the horizontal portion SC1 may be in contact with a bottom surface of the conductive support layer SP, and a bottom surface of the horizontal portion SC1 may be in contact with the top surface of the semiconductor layer 100. The sidewall portion SC2 of the source conductive pattern SC may be extended from the horizontal portion SC1 in a vertical direction to be in contact with a portion of a side surface of the conductive support layer SP. A thickness of the sidewall portion SC2 of the source conductive pattern SC may be larger than a thickness of the horizontal portion SC1, when measured in the third direction D3.

The data storage pattern DSP may be extended in the third direction D3 to enclose the side surface of each of the vertical semiconductor patterns VP. The data storage pattern DSP may be a pipe- or macaroni-shaped pattern with open top and bottom. A bottom surface of the data storage pattern DSP may be located at a level between the top and bottom surfaces of the conductive support layer SP. The data storage pattern DSP may be composed of one or more layers. In some example embodiments, the data storage pattern DSP may be a data storing layer of a NAND FLASH memory device and may include a tunnel insulating layer TIL, a charge storing layer CIL, and a blocking insulating layer BLK, which are sequentially stacked on the side surface of the vertical semiconductor pattern VP. For example, the charge storing layer CIL may be a trap insulating layer, a floating gate electrode, or an insulating layer with conductive nanodots.

A dummy data storage pattern RDSP may be disposed in the semiconductor layer 100 to be vertically spaced apart from the data storage pattern DSP. The dummy data storage pattern RDSP may have the same layer structure as the data storage pattern DSP.

Referring back to FIGS. 5, 6A, and 6B, the dummy structures DV may be provided on the first connection region CNR1 to penetrate the planarization insulating layer 120, the stack ST, the conductive support layer SP, and the dummy insulating patterns 101p, 103p, and 105p. The dummy structures DV may penetrate the pad portions of the electrodes GE. The dummy structures DV may be formed of or include at least one of silicon oxide or silicon oxynitride. Bottom surfaces of the dummy structures DV may be in contact with the semiconductor layer 100.

First, second, and third separation structures SS1, SS2, and SS3 may be provided on the semiconductor layer 100 to penetrate the stack ST. Each of the first, second, and third separation structures SS1, SS2, and SS3 may be composed of a single insulating layer or a plurality of insulating layers. The first, second, and third separation structures SS1, SS2, and SS3 may have top surfaces that are located at the same or substantially the same level.

Referring to FIGS. 5 and 6A, the first separation structures SS1 may be extended from the cell array region CAR to the first connection region CNR1 in the first direction D1 and may be spaced apart from each other in a second direction D2 crossing the first direction D1. In the cell array region CAR, the first separation structures SS1 may be provided to penetrate a first portion of the conductive support layer SP filling the first opening OP1. The first separation structures SS1 may be in contact with the semiconductor layer 100, on the cell array region CAR. The first separation structures SS1 may include a lower portion, which is provided to penetrate the first portion of the conductive support layer SP, and an upper portion, which is provided to penetrate the stack ST, and in this case, a width of the lower portion may be smaller than a width of the upper portion.

In the first connection region CNR1, the first separation structures SS1 may be provided on a second portion of the conductive support layer SP filling the second opening OP2. That is, in the first connection region CNR1, the first separation structures SS1 may be in contact with a top surface of the conductive support layer SP.

The second and third separation structures SS2 and SS3 may be provided on the first connection region CNR1. The second and third separation structures SS2 and SS3 may be provided between the first separation structures SS1. Each of the second and third separation structures SS2 and SS3 may be a bar-shaped pattern. The third separation structure SS3 may be shorter than the second separation structure SS2. The third separation structure SS3 may be disposed between insulating dams to be described below.

Referring back to FIGS. 5, 6A, and 6B, the cell contact plugs CPLG may penetrate the first and second interlayer insulating layers 130 and 140 and the planarization insulating layer 120 and may be coupled to the pad portions of the electrodes GE, respectively. The smaller the distance to the cell array region CAR, the smaller the vertical lengths of the cell contact plugs CPLG. The cell contact plugs CPLG may have top surfaces that are substantially coplanar with each other. The conductive lines CL may be disposed on the first connection region CNR1 and on the fourth interlayer insulating layer 160 and may be coupled to the cell contact plugs CPLG or the penetration plugs TP1, TP2, and TP3 through lower and upper contact plugs LCT and UCT.

Although the bit lines are not illustrated in the plan views, but as shown in FIGS. 6A and 6B, the bit lines BL may be disposed on the cell array region CAR and on the fourth interlayer insulating layer 160 to cross the stack ST and to extend in the second direction D2. The bit lines BL may be electrically connected to the vertical structures VS through lower and upper bit line contact plugs BCTa and BCTb.

Insulating dams DM1, DM2, DM3, and DM4, which are arranged in the first direction D1, may be provided on the first connection region CNR1 to penetrate the stack ST. In some example embodiments, the insulating dams DM1, DM2, DM3, and DM4 may be formed of or include at least one of silicon oxide or silicon oxynitride. Hereinafter, the insulating dams DM1, DM2, DM3, and DM4, which are arranged in the first direction D1, may be referred to as a dam group, and a plurality of dam groups may be disposed in the second direction D2. Although each dam group is illustrated to include four insulating dams DM1, DM2, DM3, and DM4-, the inventive concepts are not limited to this example, and, for example, five or more insulating dams may be provided. FIG. 5 illustrate an example in which two dam groups are provided, but the inventive concepts are not limited to this example. For example, three or more dam groups may be provided, and for concise description, a single dam group will be described below.

Mold patterns MLP may be provided in each of the insulating dams DM1, DM2, DM3, and DM4, and in this case, each of the mold patterns MLP may be placed at the same level as a corresponding one of the electrodes GE and between a corresponding pair of the insulating layers ILD. The mold patterns MLP may be formed of or include an insulating material, which is different from the insulating layers ILD. The mold patterns MLP may be formed of or include at least one of, for example, silicon nitride, silicon oxynitride, or silicon germanium. The mold patterns MLP may be overlapped with the insulating penetration pattern 111, when viewed in a plan view. That is, the mold patterns MLP and the insulating penetration pattern 111 may have the same width in the first direction D1.

First penetration plugs TP1 may be provided on the first connection region CNR1 to vertically penetrate the mold patterns MLP of the stack ST and the insulating penetration pattern 111 and may be connected to the peripheral circuit lines PLP. FIG. 6B illustrates an example in which a plurality of the first penetration plugs TP1 are connected to one of the peripheral circuit lines PLP, but in some example embodiments, the first penetration plugs TP1 may be respectively connected to different ones of the peripheral circuit lines PLP.

When viewed in a plan view, each of the insulating dams DM1, DM2, DM3, and DM4 may be provided to enclose a plurality of the first penetration plugs TP1. The insulating dams DM1, DM2, DM3, and DM4 may separate the electrodes GE from the mold patterns MLP. In other words, the first penetration plugs TP1 may be electrically disconnected from the electrodes GE, with the insulating dams DM1, DM2, DM3, and DM4 and the mold patterns MLP interposed therebetween.

The insulating dams DM1, DM2, DM3, and DM4 may include a first insulating dam DM1, which is farthest from the cell array region CAR. A second insulating dam DM2, a third insulating dam DM3, and a fourth insulating dam DM4 may be sequentially provided between the first insulating dam DM1 and the cell array region CAR.

The insulating dams DM1, DM2, DM3, and DM4 and a neighboring structure will be described in more detail with reference to FIGS. 6C, 6D, and 6E. Although the fourth insulating dam DM4 is exemplarily illustrated in FIG. 6D, each of the second and third insulating dams DM2 and DM3 may have the same or substantially the same shape as the fourth insulating dam DM4.

Each of the first and fourth insulating dams DM1 and DM4 may include a lower portion that is in contact with the conductive support layer SP. At least a portion of the lower portion of each of the first and fourth insulating dams DM1 and DM4 may be in contact with the insulating penetration pattern 111. A top surface of each of the first and fourth insulating dams DM1 and DM4 may be located at the same or substantially the same level as the top surfaces of the first, second, and third separation structures SS1, SS2, and SS3. The top surface of each of the first and fourth insulating dams DM1 and DM4 may be located at the same or substantially the same level as a top surface of the first interlayer insulating layer 130.

Each of the first and fourth insulating dams DM1 and DM4 may include a first sidewall portion SD1, a second sidewall portion SD2 spaced apart from the first sidewall portion SD1 in the first direction D1, and third and fourth sidewall portions SD3 and SD4 connecting the first sidewall portion SD1 to the second sidewall portion SD2. In the plan views of FIGS. 5 and 6E, each of the first and fourth insulating dams DM1 and DM4 is illustrated to have a shape of a rectangular ring, but in some example embodiments, it may be provided to have a shape of a circular or elliptical ring, or another two dimensional geometric shape. In each of the first and fourth insulating dams DM1 and DM4, a thickness of each of the first to fourth sidewall portions SD1, SD2, SD3, and SD4 may decrease with decreasing distance to the semiconductor substrate 10. That is, in each of the first and fourth insulating dams DM1 and DM4, a thickness of each of the first to fourth sidewall portions SD1, SD2, SD3, and SD4 may be tapered such that the thickness increases along the third direction D3.

As shown in FIG. 6C, a difference between an upper thickness t1 and a lower thickness b1 of the second sidewall portion SD2 of the first insulating dam DM1 may be larger than a difference between an upper thickness t2 and a lower thickness b2 of the first sidewall portion SD1 of the first insulating dam DM1 (i.e., t1−b1>t2−b2). Similarly, a difference between the upper thickness t1 of the second sidewall portion SD2 of the first insulating dam DM1 and the upper thickness t2 of the first sidewall portion SD1 of the first insulating dam DM1 may be larger than a difference between the lower thickness b1 of the second sidewall portion SD2 of the first insulating dam DM1 and the lower thickness b2 of the first sidewall portion SD1 of the first insulating dam DM1. In some example embodiments, the difference between the upper thickness t1 and the lower thickness b1 of the second sidewall portion SD2 of the first insulating dam DM1 may be about 1.1 to 1.5 times the difference between the upper thickness t2 and the lower thickness b2 of the first sidewall portion SD1 of the first insulating dam DM1.

In some example embodiments, the upper thickness may be a thickness measured from a top surface, and the lower thickness may be a thickness measured from a bottom surface. As an example, the upper thickness t1 of the second sidewall portion SD2 of the first insulating dam DM1 may be larger than the upper thickness t2 of the first sidewall portion SD1 of the first insulating dam DM1. In some example embodiments, the upper thickness t1 of the second sidewall portion SD2 of the first insulating dam DM1 may be about or exactly 10 nm to about or exactly 30 nm thicker than the upper thickness t2 of the first sidewall portion SD1 of the first insulating dam DM1.

The lower thickness b1 of the second sidewall portion SD2 of the first insulating dam DM1 may be substantially equal to the lower thickness b2 of the first sidewall portion SD1 of the first insulating dam DM1. Alternatively, the lower thickness b1 of the second sidewall portion SD2 of the first insulating dam DM1 may be different from the lower thickness b2 of the first sidewall portion SD1 of the first insulating dam DM1. A reduction rate in the thickness of the second sidewall portion SD2 of the first insulating dam DM1 in a downward direction may be larger than that in the first sidewall portion SD1 of the first insulating dam DM1. The third and fourth sidewall portions SD3 and SD4 of the first insulating dam DM1 may have the same or substantially the same thickness and profile as the first sidewall portion SD1, as shown in FIG. 6E.

As shown in FIG. 6D, a difference between an upper thickness t3 and a lower thickness b3 of the second sidewall portion SD2 of the fourth insulating dam DM4 may be equal to or substantially equal to a difference between an upper thickness t4 and a lower thickness b4 of the first sidewall portion SD1 of the fourth insulating dam DM4. The difference between the upper thickness t1 and the lower thickness b1 of the second sidewall portion SD2 of the first insulating dam DM1 may be larger than the difference between the upper thickness t3 and the lower thickness b3 of the second sidewall portion SD2 of the fourth insulating dam DM4. In some example embodiments, the difference between the upper thickness t1 and the lower thickness b1 of the second sidewall portion SD2 of the first insulating dam DM1 may be about 1.1 to 1.5 times the difference between the upper thickness t3 and the lower thickness b3 of the second sidewall portion SD2 of the fourth insulating dam DM4. As an example, for the fourth insulating dam DM4, the first, second, third, and fourth sidewall portions SD1, SD2, SD3, and SD4 may be provided to have the same thickness and the same profile.

The first insulating dam DM1 may be an insulating dam that is closest to the second connection region CNR2, on which the planarization insulating layer 120 is formed to have the largest thickness. Furthermore, in the first insulating dam DM1, the second sidewall portion SD2 may be closer to the second connection region CNR2 than other sidewall portions. According to some example embodiments of the inventive concepts, as will be described in more detail below with reference to a fabrication method, the second sidewall portion SD2 of the first insulating dam DM1 (in particular, a lower portion of the second sidewall portion SD2 of the first insulating dam DM1) may be maintained to have the same or substantially the same thickness as other sidewall portions, and thus, it may be possible to prevent or reduce the likelihood of the electrodes GE and the first penetration plugs TP1 from being unintentionally connected to each other and to prevent or reduce the likelihood of a parasitic current from being increased.

Second penetration plugs TP2 may be provided on the second connection region CNR2 to penetrate the planarization insulating layer 120 and to be coupled to the conductive support layer SP. By contrast, the second penetration plugs TP2 may penetrate the planarization insulating layer 120, the conductive support layer SP, and the dummy insulating patterns 101p, 103p, and 105p and may be coupled to the semiconductor layer 100. The second penetration plugs TP2 may be horizontally spaced apart from the stack ST.

Third penetration plugs TP3 may be provided on the second connection region CNR2 to penetrate the planarization insulating layer 120 and the buried insulating pattern 110 and to be coupled to the peripheral circuit lines PLP. The third penetration plugs TP3 may be horizontally spaced apart from the stack ST.

The first, second, and third penetration plugs TP1, TP2, and TP3 may have the same or substantially the same vertical length and may be formed of or include the same conductive material. In some example embodiments, the first and third penetration plugs TP1 and TP3 may have the same or substantially the same vertical length and the second penetration plug TP2 may have a smaller vertical length. Each of the first, second, and third penetration plugs TP1, TP2, and TP3 may include a barrier metal layer, which is formed of or includes at least one of conductive metal nitrides (e.g., titanium nitride and tantalum nitride), and a metal layer, which is formed of or includes at least one of metals (e.g., tungsten, titanium, and tantalum). A connection conductive pattern ICT may be disposed on the second connection region CNR2 and on the second interlayer insulating layer 140 and may be connected to the third penetration plug TP3.

FIGS. 7A to 16A are sectional views which are taken along the lines A-A' and B-B' of FIG. 5 to illustrate a method of fabricating a semiconductor device according to some example embodiments of the inventive concept. FIGS. 7B to 16B are sectional views which are taken along the line C-C' of FIG. 5 to illustrate a method of fabricating a semiconductor device according to some example embodiments of the inventive concept.

Figure 7A:
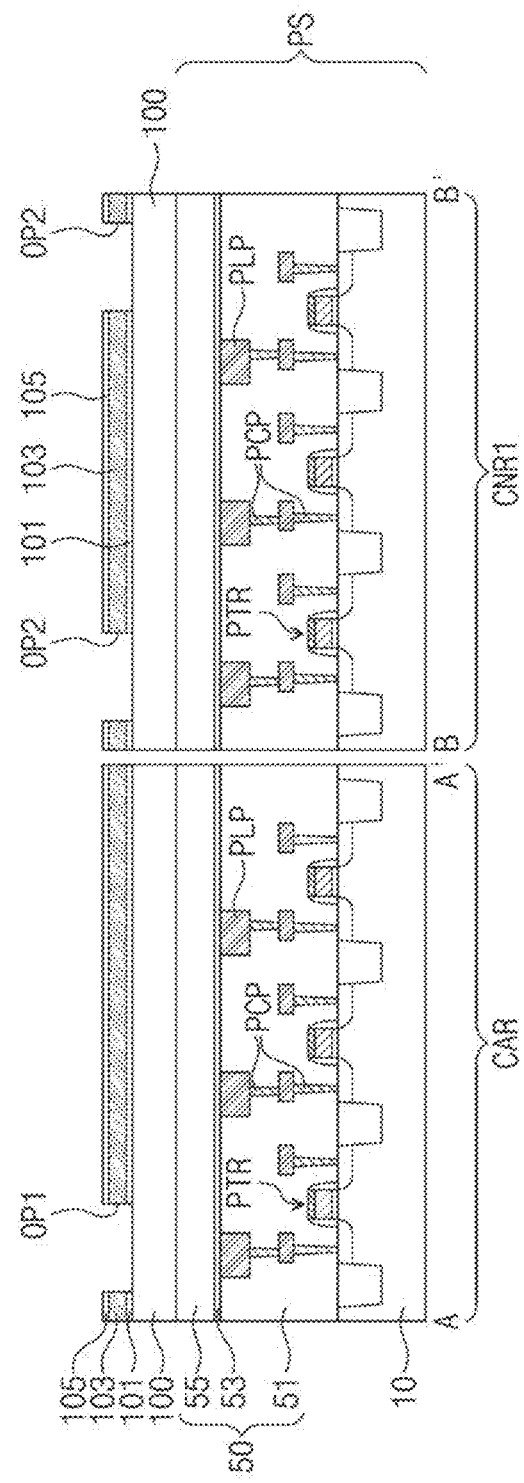
FIGS. 7A, 8A, 9A, 10A, 11A, 12A, 13A, 14A, 15A, and 16A are sectional views which are taken along the lines A-A' and B-B' of FIG. 5 to illustrate a method of fabricating a semiconductor device according to some example embodiments of the inventive concept.
Figure 7B:
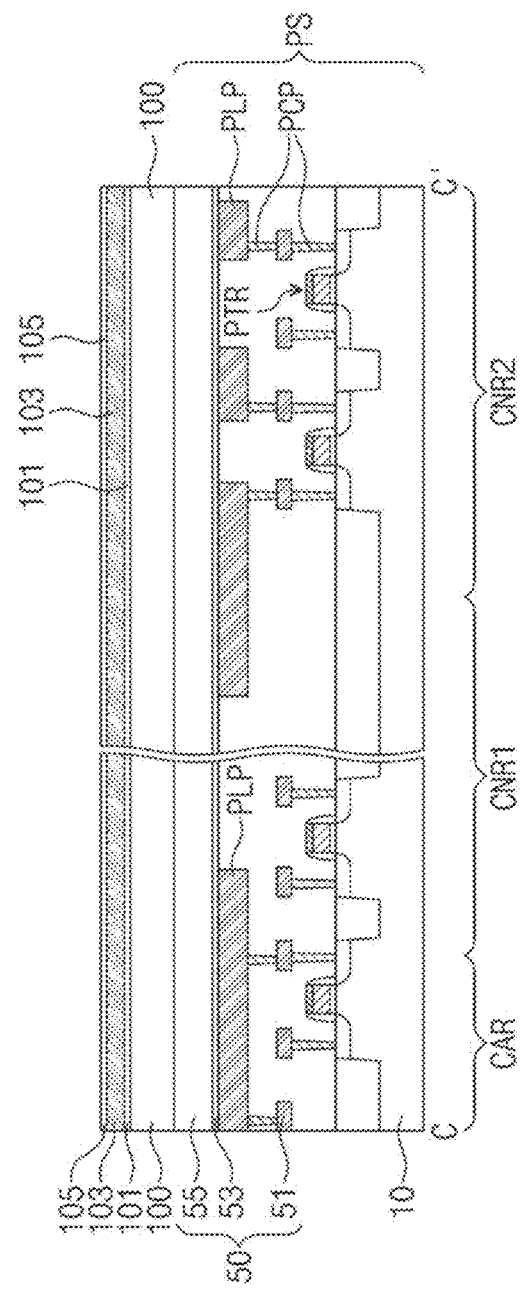

Referring to FIGS. 5, 7A, and 7B, the peripheral circuit structure PS may be formed on the semiconductor substrate 10. The formation of the peripheral circuit structure PS may include forming the peripheral circuits PTR on the semiconductor substrate 10, forming peripheral interconnection structures, which are connected to the peripheral circuits PTR, and forming the lower insulating layer 50. In some example embodiments, the peripheral circuits PTR may include MOS transistors, in which the semiconductor substrate 10 is used as channel regions.

The lower insulating layer 50 may include one or more insulating layers covering the peripheral circuits PTR. The lower insulating layer 50 may include the first lower insulating layer 51, the second lower insulating layer 55, and the etch stop layer 53 between the first and second lower insulating layers 51 and 55. The lower insulating layer 50 may include, for example, a silicon oxide layer, a silicon nitride layer, a silicon oxynitride layer, and/or a low-k dielectric layer.

The formation of the peripheral interconnection structures may include forming the peripheral contact plugs PCP to penetrate portions of the lower insulating layer 50 and forming the peripheral circuit lines PLP connected to the peripheral contact plugs PCP.

Next, the semiconductor layer 100 may be formed by depositing a semiconductor material on the lower insulating layer 50. The semiconductor layer 100 may be formed of or include at least one of semiconductor materials (e.g., silicon (Si), germanium (Ge), silicon germanium (SiGe), gallium arsenic (GaAs), indium gallium arsenic (InGaAs), aluminum gallium arsenic (AlGaAs), or compounds thereof). The semiconductor layer 100 may be formed of or include a doped semiconductor material and/or an undoped or intrinsic semiconductor material. The semiconductor layer 100 may be formed to have one of single-crystalline, poly-crystalline, and amorphous structures.

A first insulating layer 101, a second insulating layer 103, a third insulating layer 105 may be sequentially stacked on the semiconductor layer 100. The first insulating layer 101 may be formed by thermally oxidizing a surface of the semiconductor layer 100 or by depositing a silicon oxide layer. The second insulating layer 103 may be formed of a material having an etch selectivity with respect to the first insulating layer 101 and the third insulating layer 105. As an example, the second insulating layer 103 may be at least one of a silicon nitride layer, a silicon oxynitride layer, a silicon carbide layer, and a silicon germanium layer. The third insulating layer 105 may be formed by depositing a silicon oxide layer.

The first, second, and third insulating layers 101, 103, and 105 may have the first and second openings OP1 and OP2, which are formed on the cell array region CAR and the first connection region CNR1 to expose portions of the semiconductor layer 100.

The formation of the first and second openings OP1 and OP2 may include forming a mask pattern to expose portions of the first connection region CNR1 and the cell array region CAR and etching the first, second, and third insulating layers 101, 103, and 105 using the mask pattern as an etch mask to expose the semiconductor layer 100. The mask pattern may be removed, after the formation of the first and second openings OP1 and OP2.

Figure 8A:
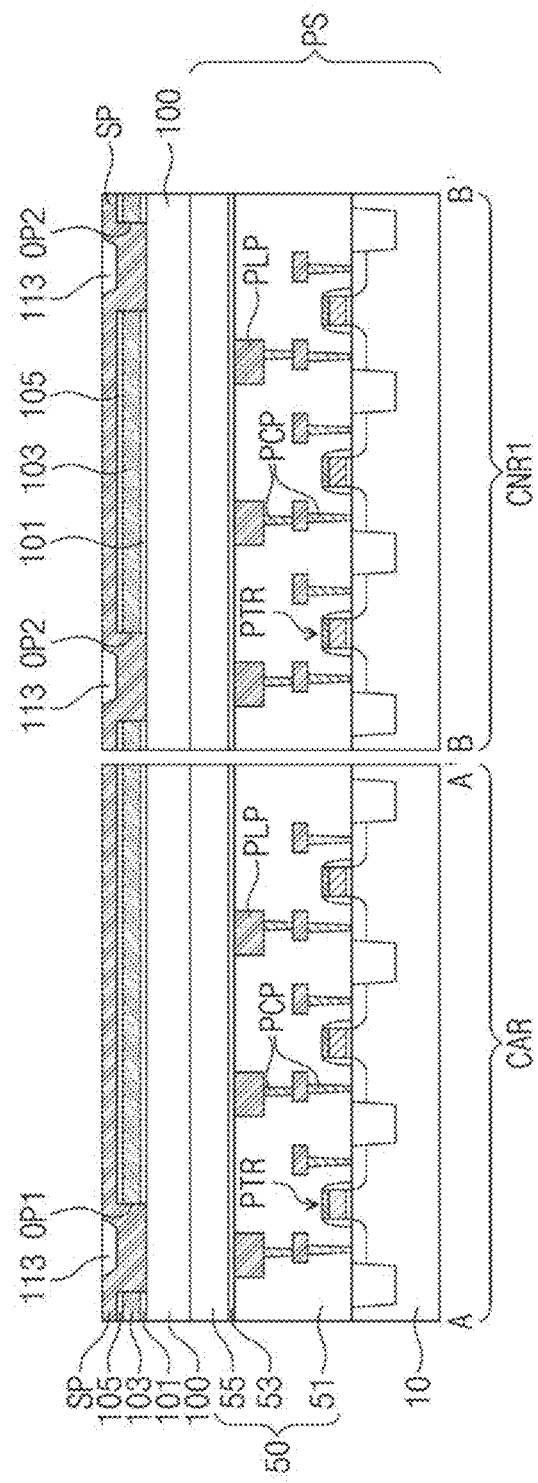
Figure 8B:
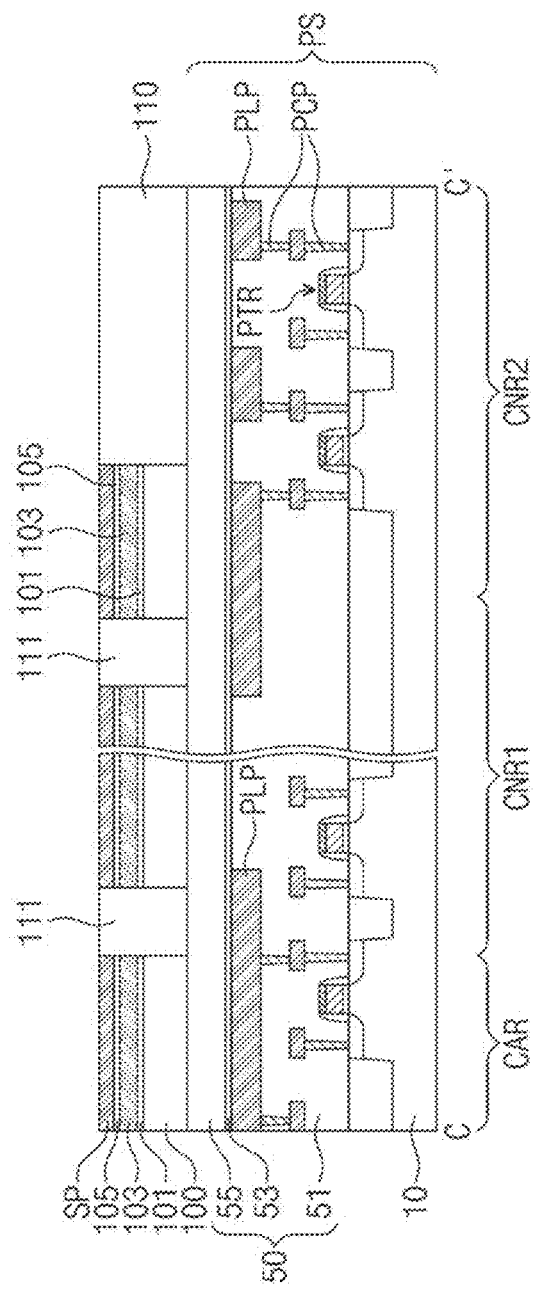

Referring to FIGS. 5, 8A, and 8B, the conductive support layer SP may be deposited on the third insulating layer 105 to have a uniform thickness. The conductive support layer SP may fill the first and second openings OP1 and OP2 of the first, second, and third insulating layers 101, 103, and 105, on the cell array region CAR. In the first and second openings OP1 and OP2, the conductive support layer SP may be in direct contact with the semiconductor layer 100. The conductive support layer SP may be a poly-silicon layer, which is doped with n-type dopants and/or carbon (C).

Thereafter, the conductive support layer SP, the third insulating layer 105, the second insulating layer 103, the first insulating layer 101, and the semiconductor layer 100 may be patterned to form penetration holes, which expose portions of the lower insulating layer 50, on the first and second connection regions CNR1 and CNR2. Next, the insulating penetration patterns 111 may be formed to fill the penetration holes on the first connection region CNR1, and the buried insulating pattern 110 may be formed to fill the penetration holes on the second connection region CNR2. The insulating penetration pattern 111 and the buried insulating pattern 110 may be formed by filling the penetration holes with an insulating material and performing a planarization process to expose the top surface of the conductive support layer SP. During the formation of the insulating penetration pattern 111 and the buried insulating pattern 110, portions 113 of the insulating material may be left on the conductive support layer SP in the first and second openings OP1 and OP2. The insulating penetration pattern 111 and the buried insulating pattern 110 may be formed of or include at least one of silicon oxide or silicon oxynitride.

Figure 9A:
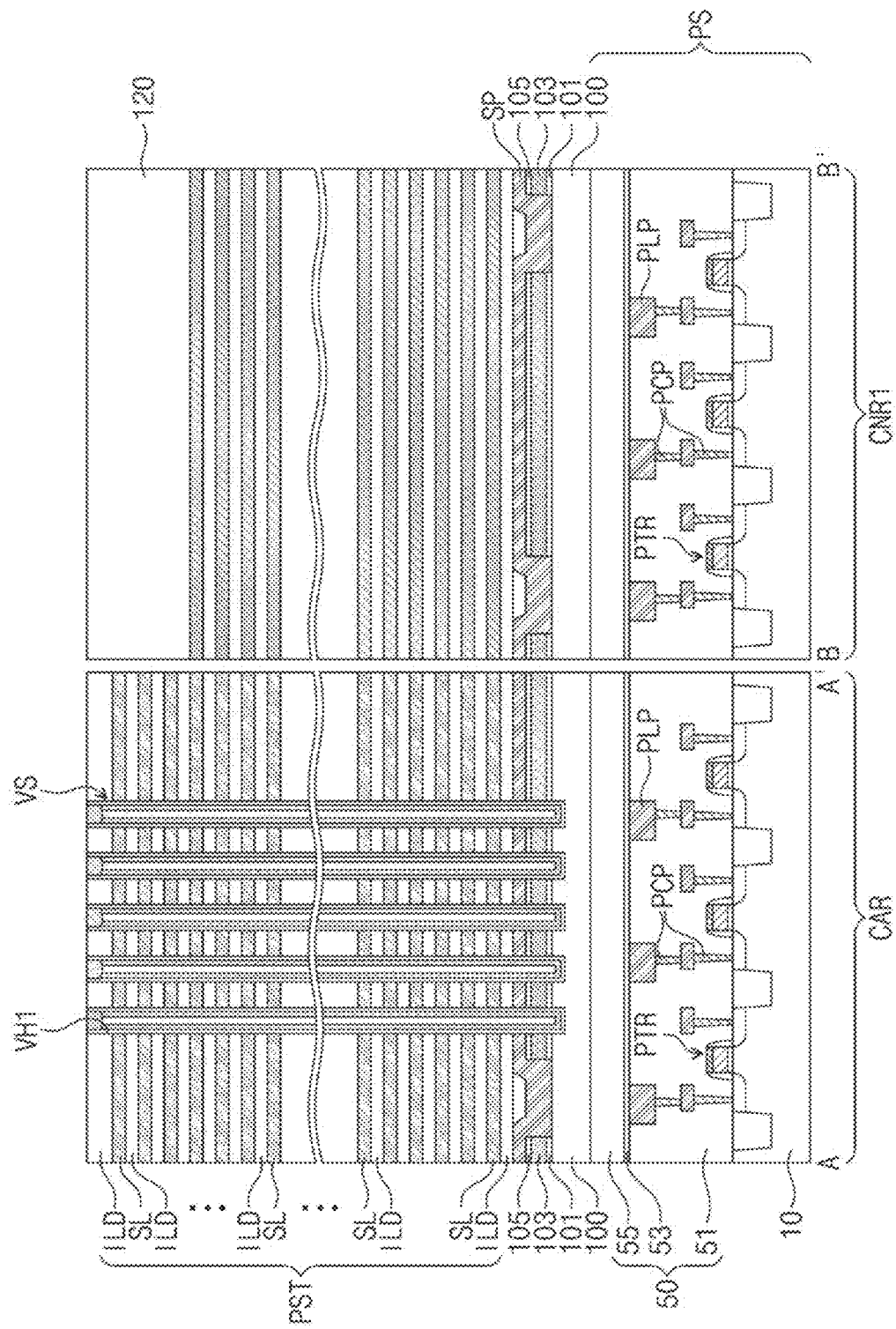
Figure 9B:
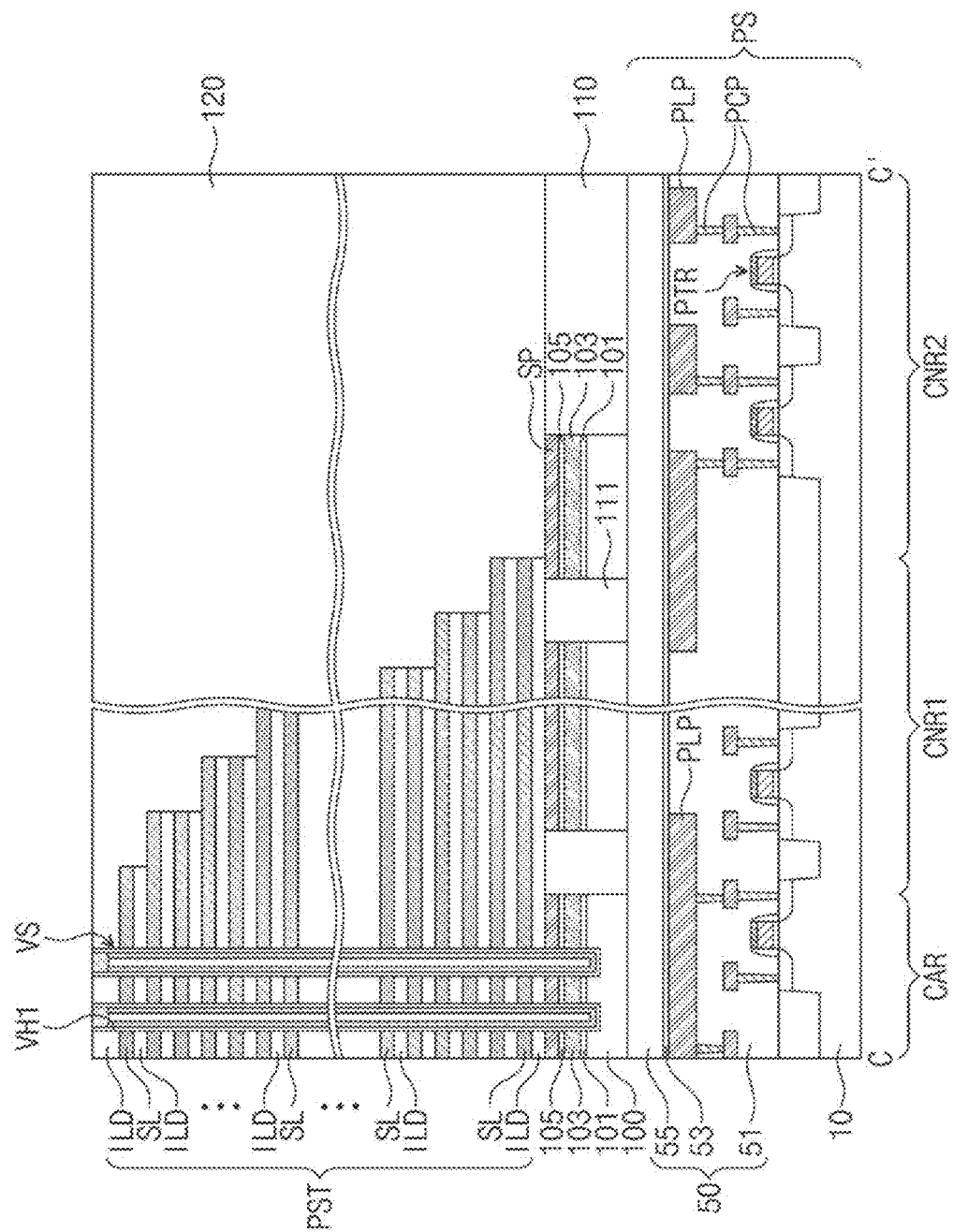

Referring to FIGS. 5, 9A, and 9B, a mold structure PST, in which the insulating layers ILD and sacrificial layers SL are alternately stacked in a vertical direction, may be formed on the conductive support layer SP. The mold structure PST may have a stepwise structure on the first connection region CNR1. In some example embodiments, the stepwise structure of the mold structure PST may be formed through a plurality of etching process.

The sacrificial layers SL may be formed of or include a material, which can be etched with an etch selectivity with respect to the insulating layers ILD. As an example, the sacrificial layers SL may be formed of an insulating material different from the insulating layers ILD. The sacrificial layers SL may be formed of the same material as the second insulating layer 103. For example, the sacrificial layers SL may be formed of silicon nitride, and the insulating layers ILD may be formed of silicon oxide. After the formation of the mold structure PST, the planarization insulating layer 120 may be formed on the buried insulating pattern 110 to have a stepwise structure of the mold structure PST. The planarization insulating layer 120 may be formed of or include at least one of silicon oxide or silicon oxynitride.

The vertical structures VS may be formed to penetrate the mold structure PST on the cell array region CAR. The formation of the vertical structures VS may include forming first vertical holes VH1 to penetrate the mold structure PST, the conductive support layer SP, and the first to third insulating layers 101, 103, and 105, and sequentially depositing a data storing layer and a vertical semiconductor layer in each of the first vertical holes VH1. When the vertical structures VS are formed, bottom surfaces of the first vertical holes VH1 may be located at a level lower than a top surface of the semiconductor layer 100. The data storing layer may be deposited using a chemical vapor deposition method or an atomic layer deposition method to have a uniform thickness on bottom and inner side surfaces of the first vertical holes VH1. The data storing layer may include a tunneling insulating layer, a charge storing layer, and a blocking insulating layer, which are sequentially stacked. The vertical semiconductor layer may be deposited using a chemical vapor deposition method or an atomic layer deposition method to have a uniform thickness on the data storing layer. After the formation of the data storing layer and the vertical semiconductor layer, a gap-filling insulating layer may be filled with the first vertical holes VH1. Thereafter, a planarization process may be performed on the gap-filling insulating layer, the vertical semiconductor layer, and the data storing layer to expose a top surface of the uppermost insulating layer ILD of the mold structure PST.

Bit line conductive pads may be formed atop the vertical semiconductor patterns DSP (e.g., see FIG. 6F). The bit line conductive pads may be impurity-doped regions or may be formed of a conductive material.

Figure 10A:
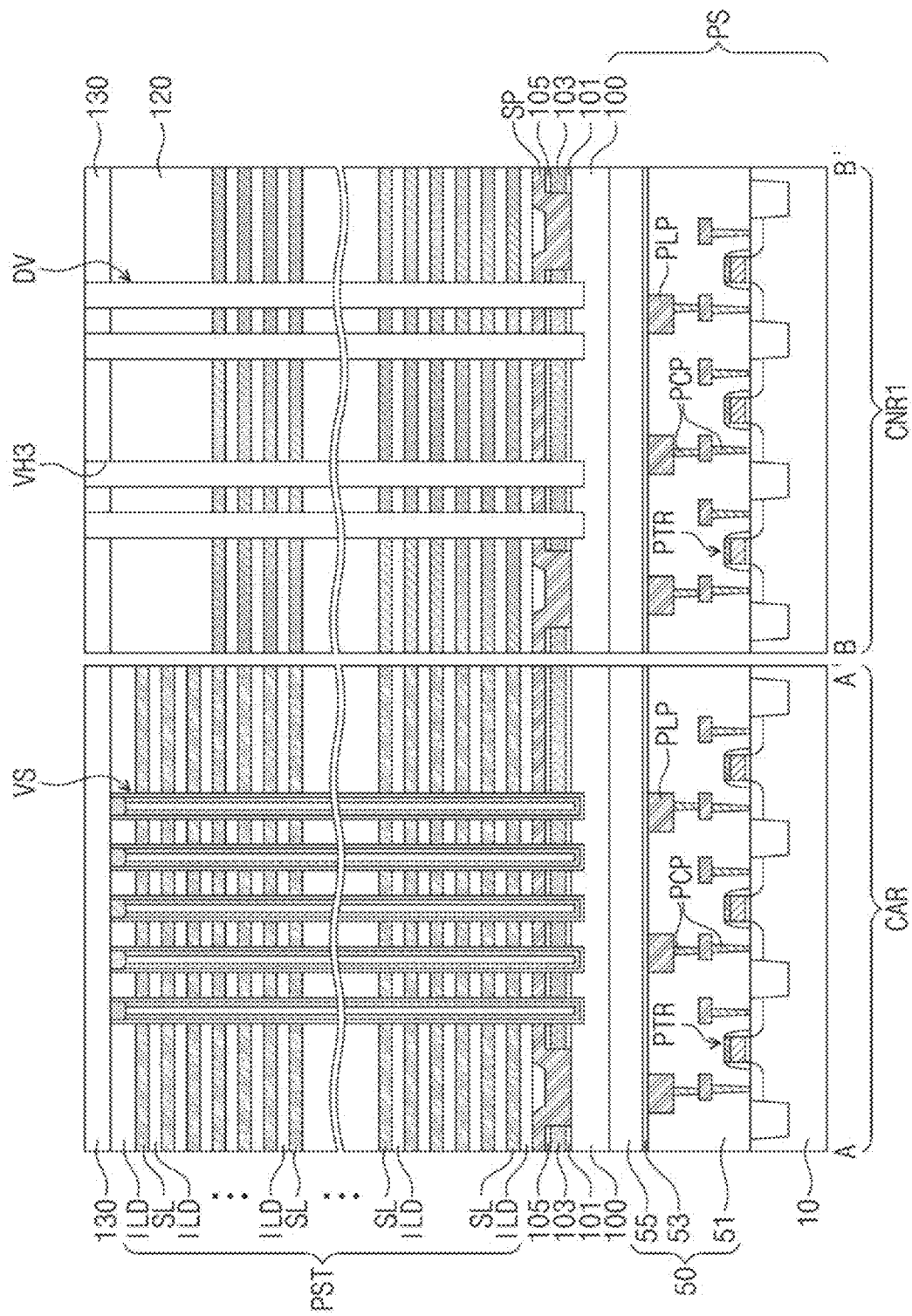
Figure 10B:
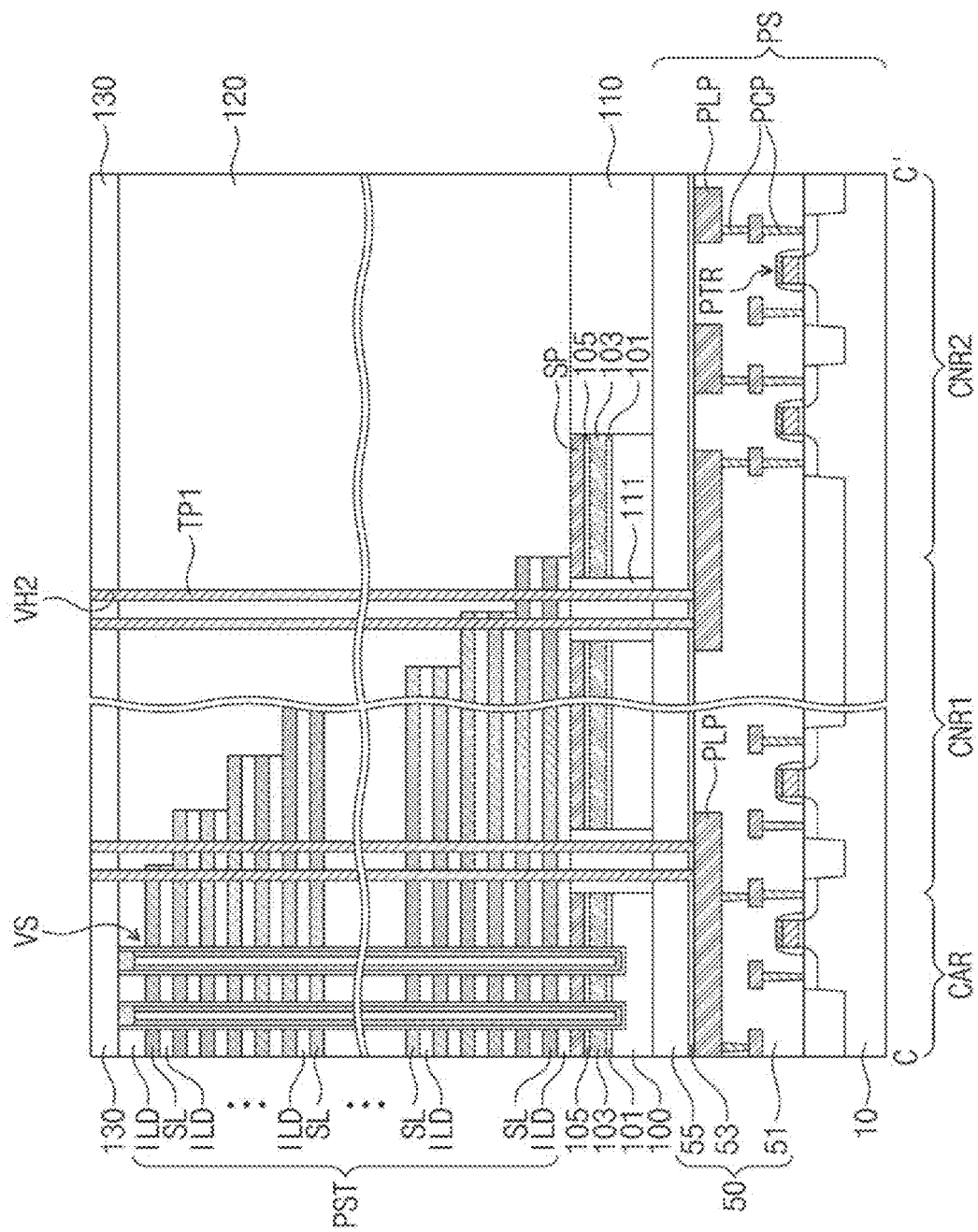

Referring to FIGS. 5, 10A, and 10B, the first interlayer insulating layer 130 may be formed on the planarization insulating layer 120 to cover top surfaces of the vertical structures VS, after the formation of the vertical structures VS. Second vertical holes VH2 may be formed on the first connection region CNR1 to penetrate the mold structure PST and the insulating penetration pattern 111 and to expose the peripheral circuit lines PLP. The first penetration plugs TP1 may be formed in the second vertical holes VH2. In some example embodiments, the first penetration plugs TP1 may be formed by filling the second vertical holes VH2 with a metallic material (e.g., tungsten).

Third vertical holes VH3 may be formed to penetrate the mold structure PST and to expose the semiconductor layer 100. The dummy structures DV may be formed to fill the third vertical holes VH3. In some example embodiments, the dummy structures DV may be formed of or include at least one of silicon oxide or silicon oxynitride. The second vertical holes VH2 and the third vertical holes VH3 may be formed at the same time, but in some example embodiments, they may be sequentially formed.

Figure 11A:
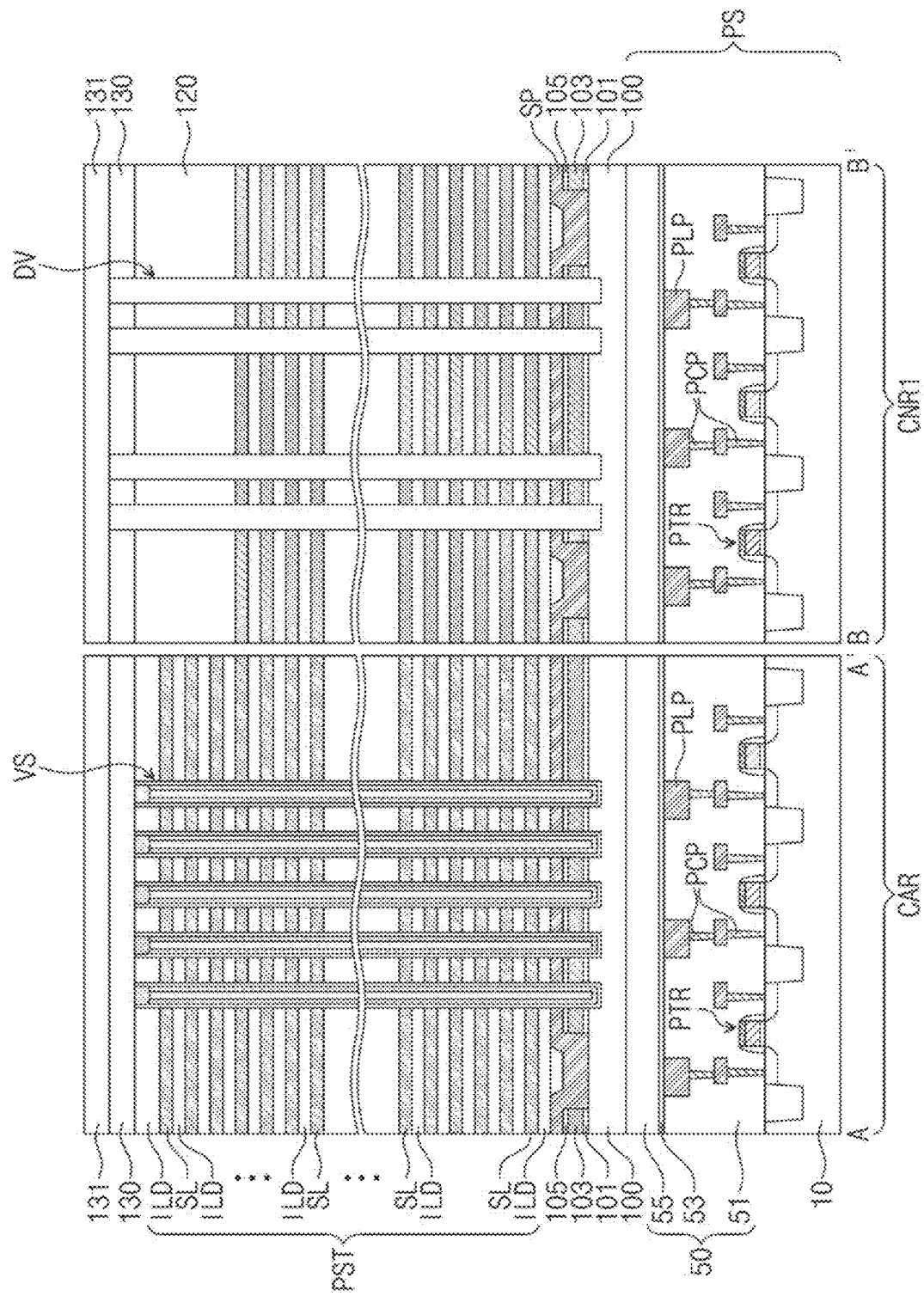
Figure 11B:
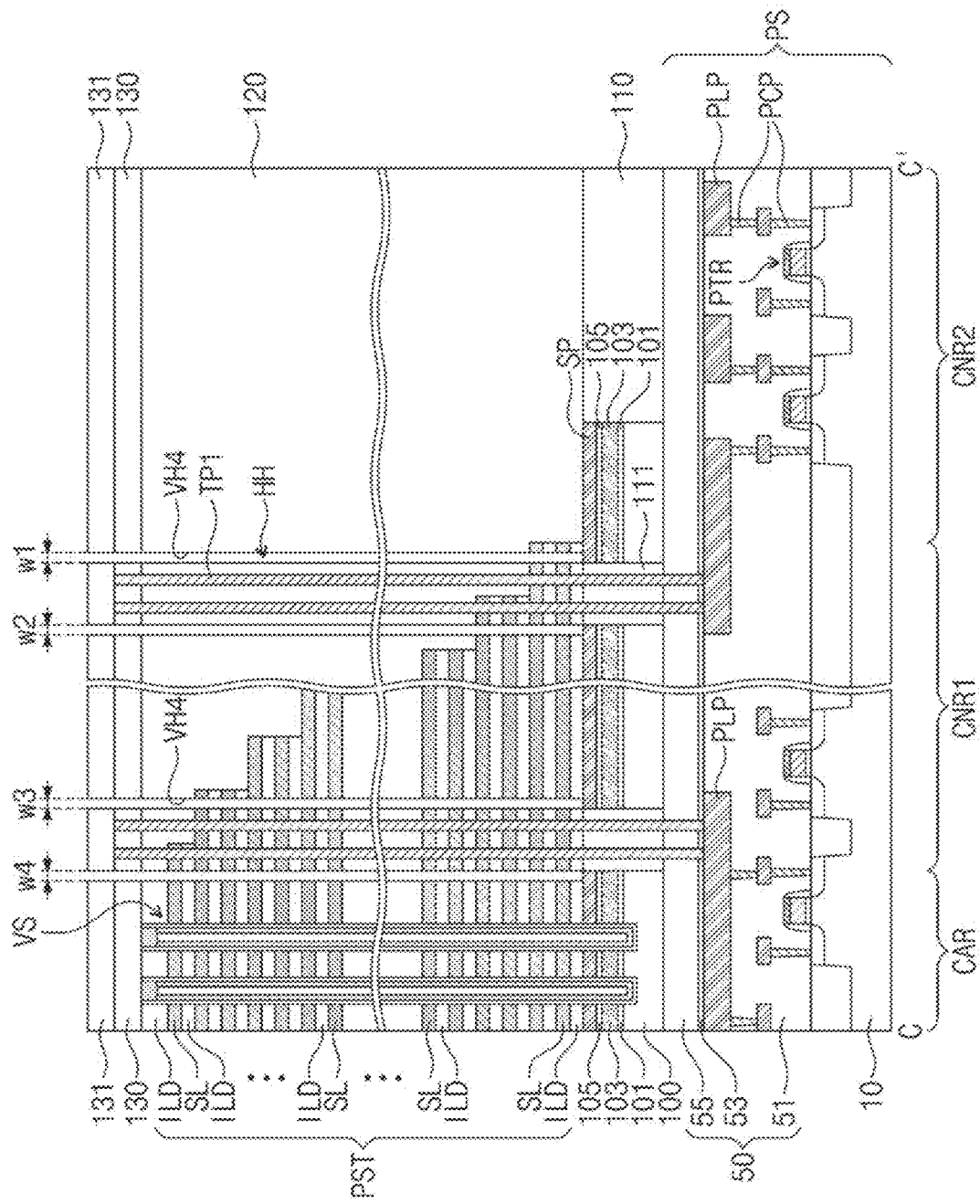

Referring to FIGS. 5, 11A, and 11B, a first mask pattern 131 may be formed on the first interlayer insulating layer 130. The first mask pattern 131 may include ring-shaped openings, which are formed on the first connection region CNR1 to enclose the first penetration plugs TP1. An etching process using the first mask pattern 131 may be performed to form fourth vertical holes VH4 on the first connection region CNR1. The fourth vertical holes VH4 may be formed to have shapes corresponding to the shapes of the insulating dams DM1, DM2, DM3, and DM4 described with reference to FIGS. 5, 6C, and 6D. As an example, the outermost vertical hole portion HH, in which the second sidewall portion SD2 of the first insulating dam DM1 shown in FIG. 6C will be formed, may have an upper width w1 which is larger than upper widths w1, w2, and w3 of other vertical hole portions. Lower portions of the vertical hole portions may have the same or substantially the same width, as described with reference to FIGS. 6C and 6D.

The outermost vertical hole portion HH may be closer to the second connection region CNR2, on which the planarization insulating layer 120 has the largest thickness, than other vertical hole portions. When the fourth vertical holes VH4 are formed, the planarization insulating layer 120 may directly exert a compressive stress on the outermost vertical hole portion HH, and thus, the width of the outermost vertical hole portion HH may be reduced, compared with other vertical hole portions. As a result, if the outermost vertical hole portion HH is formed to have the same upper width as other portions, a lower portion of the outermost vertical hole portion HH may not be extended to some of the sacrificial layers SL. As an example, the lower portion of the outermost vertical hole portion HH may not reach the conductive support layer SP. In this case, a lower portion of the first insulating dam DM1 may not reach the conductive support layer SP, and thus, the lowermost and/or next lowermost ones of the electrodes GE, which will be formed in a subsequent step, may be extended to the first penetration plugs TP1. This may lead to an unintentional connection between the electrodes GE and the first penetration plugs TP1 or an increase in parasitic current therebetween. By contrast, according to some example embodiments of the inventive concepts, since the upper width w1 of the outermost vertical hole portion HH is larger than those of other portions, it may be possible to solve or reduce the occurrence the above problems.

Figure 12A:
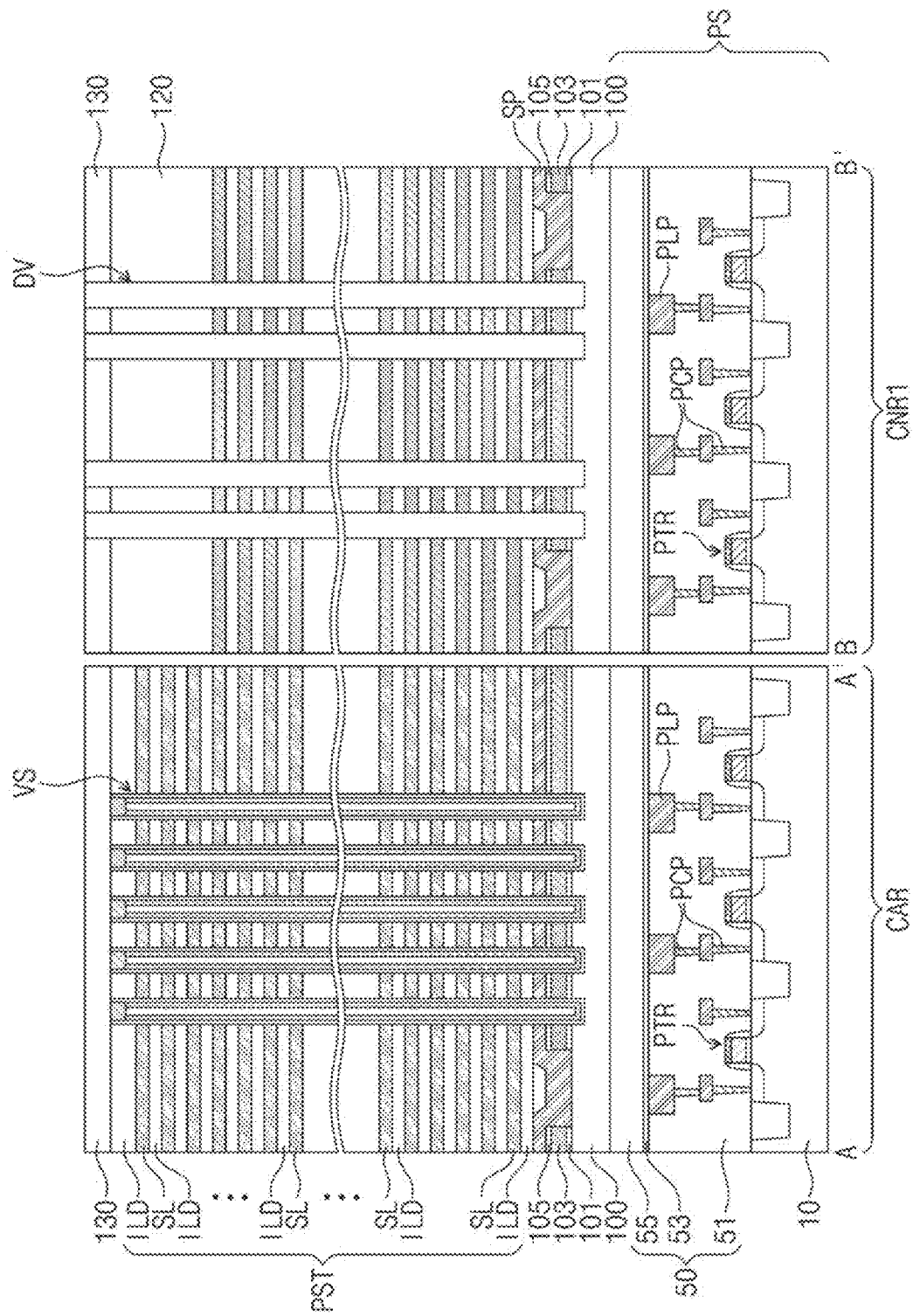
Figure 12B:
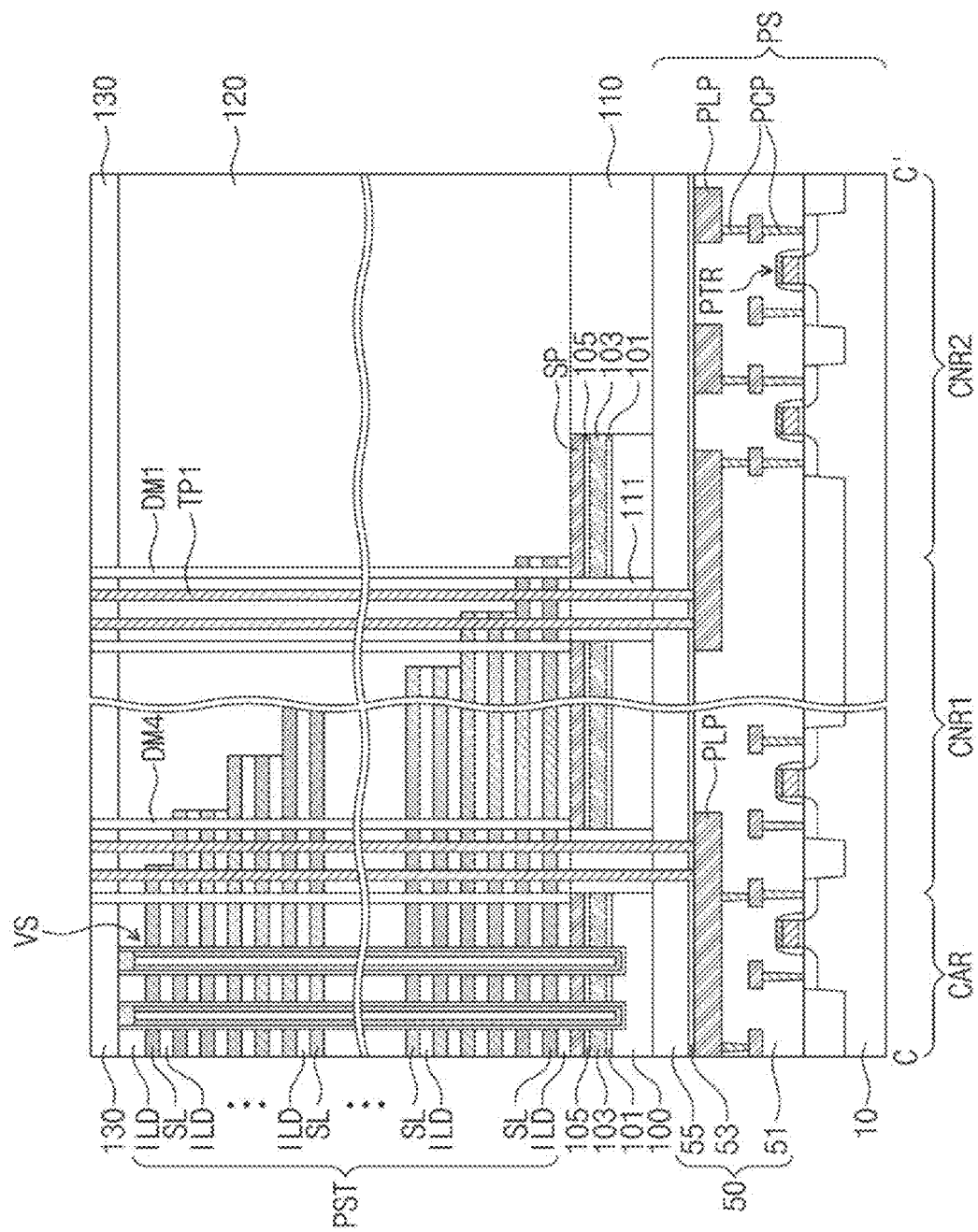

Referring to FIGS. 5, 12A, and 12B, the insulating dams DM1, DM2, DM3, and DM4 may be formed by filling the fourth vertical holes VH4 with an insulating layer, after the removal of the first mask pattern 131. The insulating dams DM1, DM2, DM3, and DM4 may be formed of or include at least one of silicon oxide or silicon oxynitride. In some example embodiments, first and second oxide layers may be sequentially formed to fill the fourth vertical holes VH4. The first oxide layer may be formed by an atomic layer deposition process. The second oxide layer may be formed by a spin coating process. In the case where the fourth vertical holes VH4 are not fully filled, an air gap may be left in the insulating dams DM1, DM2, DM3, and DM4.

The formation of the insulating dams DM1, DM2, DM3, and DM4 may include a planarization process. Each of the insulating dams DM1, DM2, DM3, and DM4 may penetrate the lowermost layer of the sacrificial layers SL. Lower portions of the insulating dams DM1, DM2, DM3, and DM4 may be in contact with the conductive support layer SP and/or the insulating penetration pattern 111.

Figure 13A:
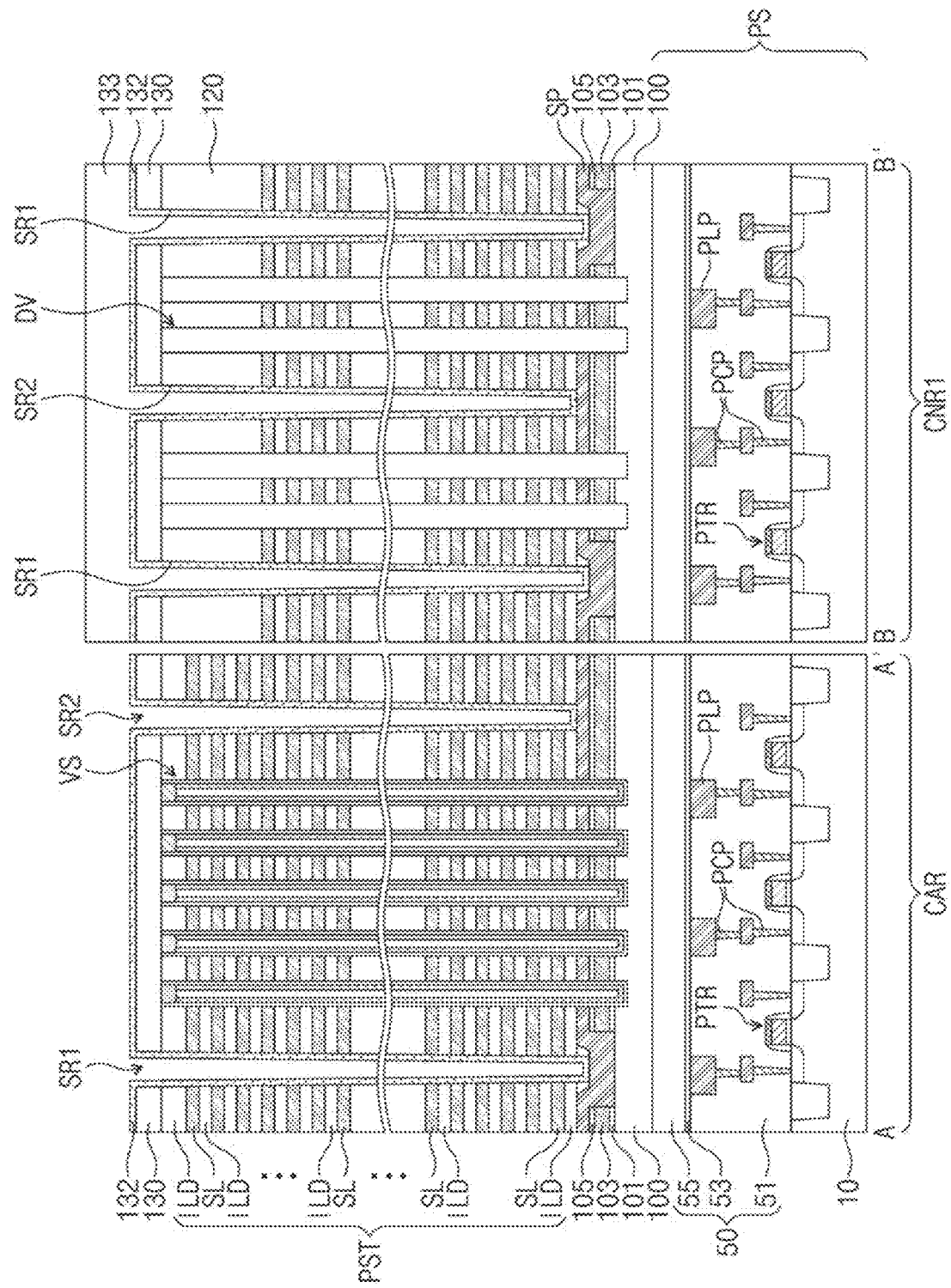

Referring to FIGS. 5, 13A, and 13B, first and second separation trenches SR1 and SR2 may be formed to penetrate the mold structure PST and to expose the conductive support layer SP. The first and second separation trenches SR1 and SR2 may be formed by anisotropically etching the planarization insulating layer 120 and the mold structure PST, and the conductive support layer SP may be used as an etch stop layer, during the anisotropic etching process. A sacrificial spacer layer 132 may be formed to conformally cover inner surfaces of the first and second separation trenches SR1 and SR2. The sacrificial spacer layer 132 may cover side and bottom surfaces of the first and second separation trenches SR1 and SR2 with a uniform thickness. The sacrificial spacer layer 132 may be formed of or include a material (e.g., poly-silicon) having an etch selectivity with respect to the mold structure PST. The sacrificial spacer layer 132 may be deposited using a chemical vapor deposition method or an atomic layer deposition method to have a uniform thickness on the inner surfaces of the first and second separation trenches SR1 and SR2. The sacrificial spacer layer 132 may be deposited to have a thickness that is smaller than about half of the width of the first and second separation trenches SR1 and SR2. Accordingly, the sacrificial spacer layer 132 may define gap regions in the first and second separation trenches SR1 and SR2.

After the formation of the sacrificial spacer layer 132, a second mask pattern 133 may be formed on the first and second connection regions CNR1 and CNR2 to cover the sacrificial spacer layer 132. The second mask pattern 133 may expose the sacrificial spacer layer 132, which is formed on the cell array region CAR to cover the first and second separation trenches SR1 and SR2. The second mask pattern 133 may be formed of or include at least one of, for example, silicon nitride or amorphous carbon layer (ACL).

Figure 14A:
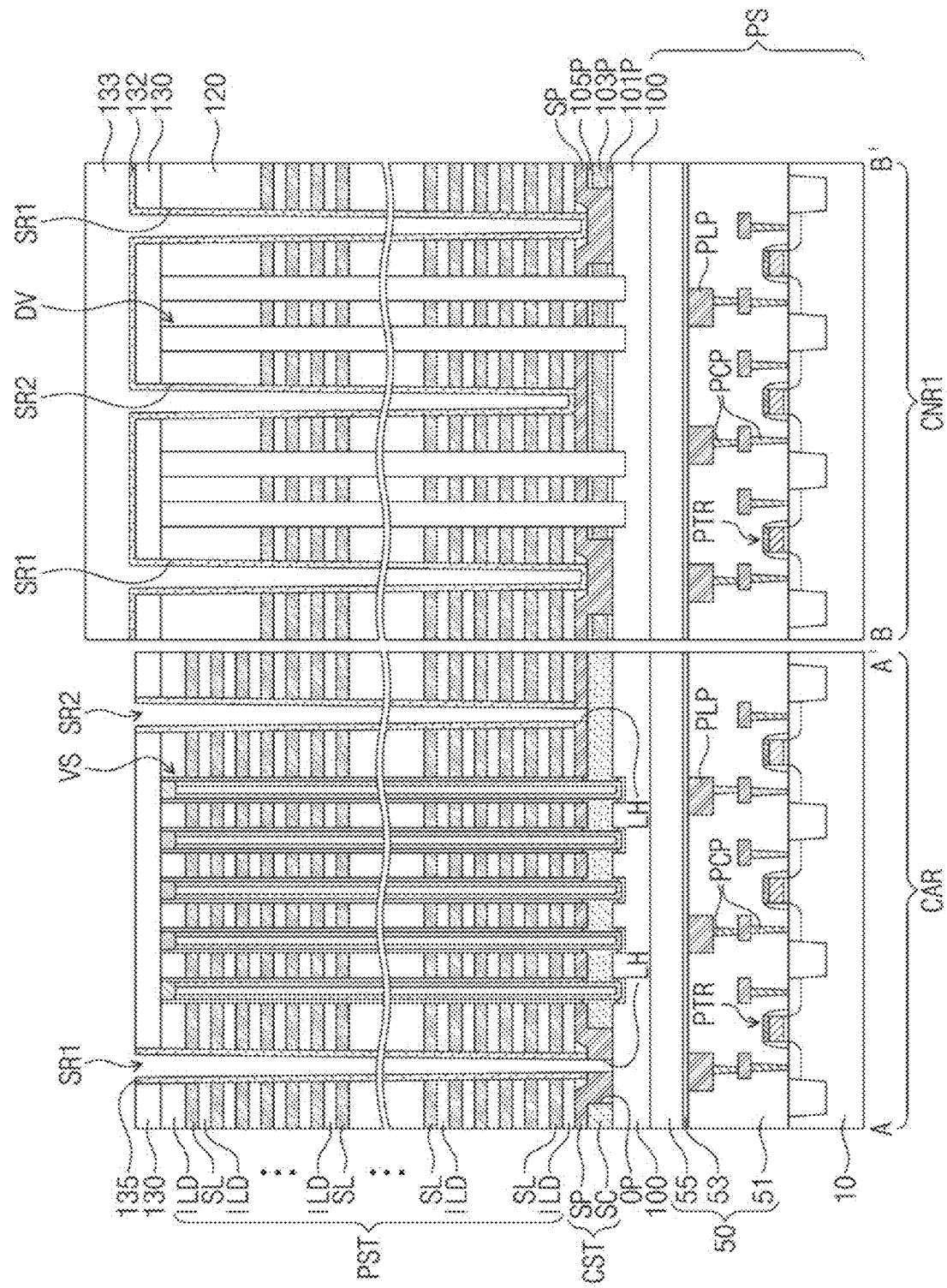
Figure 14B:
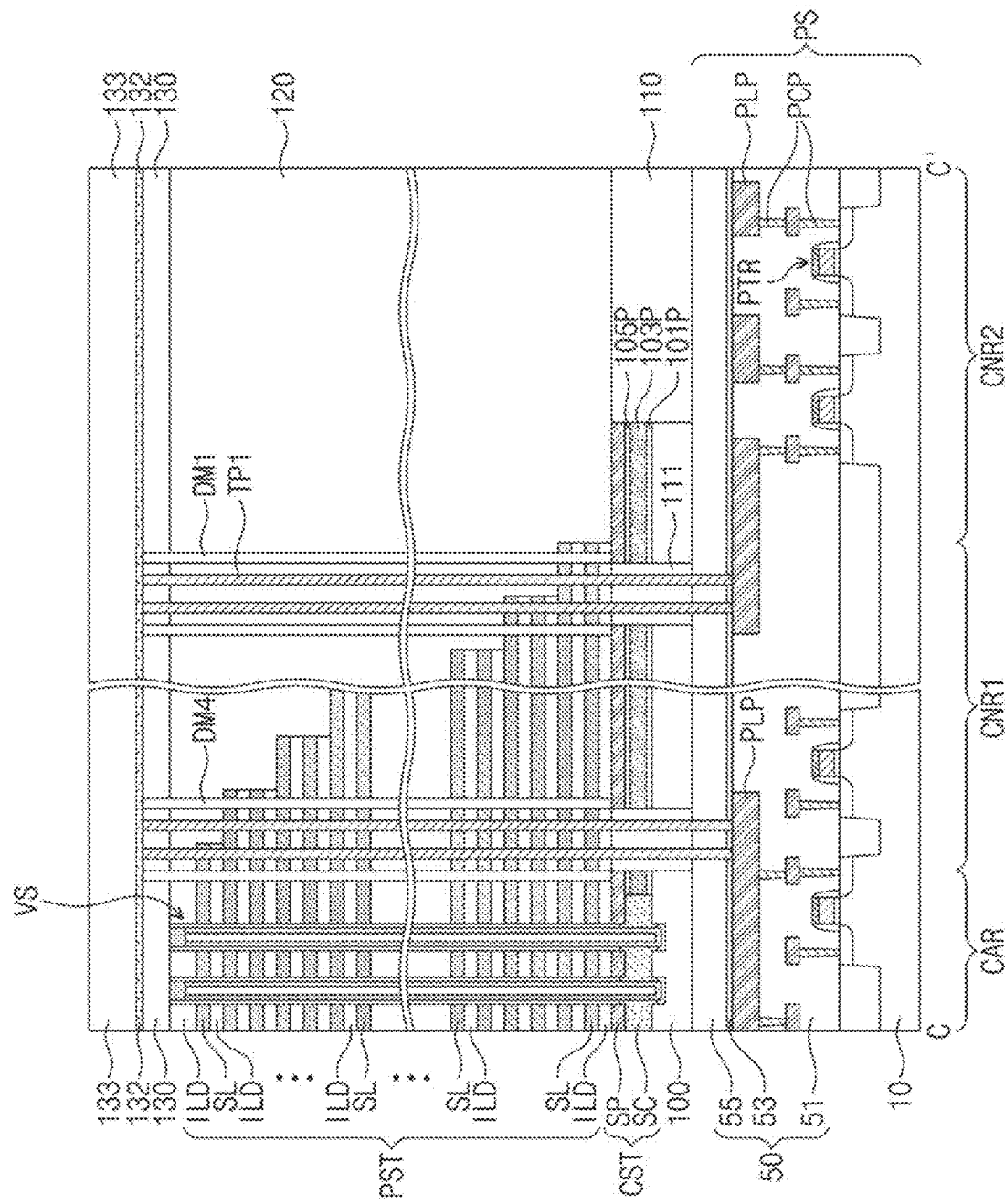

Referring to FIGS. 5, 14A, and 14B, an anisotropic etching process may be performed on the sacrificial spacer layer 132 exposed by the second mask pattern 133. Accordingly, a sacrificial spacer 135 may be formed on the cell array region CAR to cover the side surfaces of the first and second separation trenches SR1 and SR2.

During the anisotropic etching process for forming the sacrificial spacer 135, lower holes LH may be formed on the cell array region CAR to penetrate portions of the conductive support layer SP, which are located below the first and second separation trenches SR1 and SR2. Some of the lower holes LH may be formed to expose portions of the semiconductor layer 100 in the first openings OP1.

Portions of the first, second, and third insulating layers 101, 103, and 105, which are located on the cell array region CAR, may be replaced with the source conductive pattern SC. In detail, the formation of the source conductive pattern SC may include isotropically etching the first, second, and third insulating layers 101, 103, and 105, which are exposed through the lower holes LH. The formation of the source conductive pattern SC may include isotropically etching portions of the data storage pattern DSP covering the side surface of the vertical semiconductor pattern VP (e.g., see FIG. 6F). Accordingly, portions of the vertical semiconductor patterns VP may be exposed. Thereafter, the source conductive pattern SC may be formed by depositing a doped poly silicon layer. As a result, the source structure CST may be formed between the semiconductor layer 100 and the mold structure PST.

According to some example embodiments of the inventive concepts, when the source conductive pattern SC is formed on the cell array region CAR, portions of the first, second, and third insulating layers 101, 103, and 105 on the first connection region CNR1 may be left to form the dummy insulating patterns 101p, 103p, and 105p.

Figure 15A:
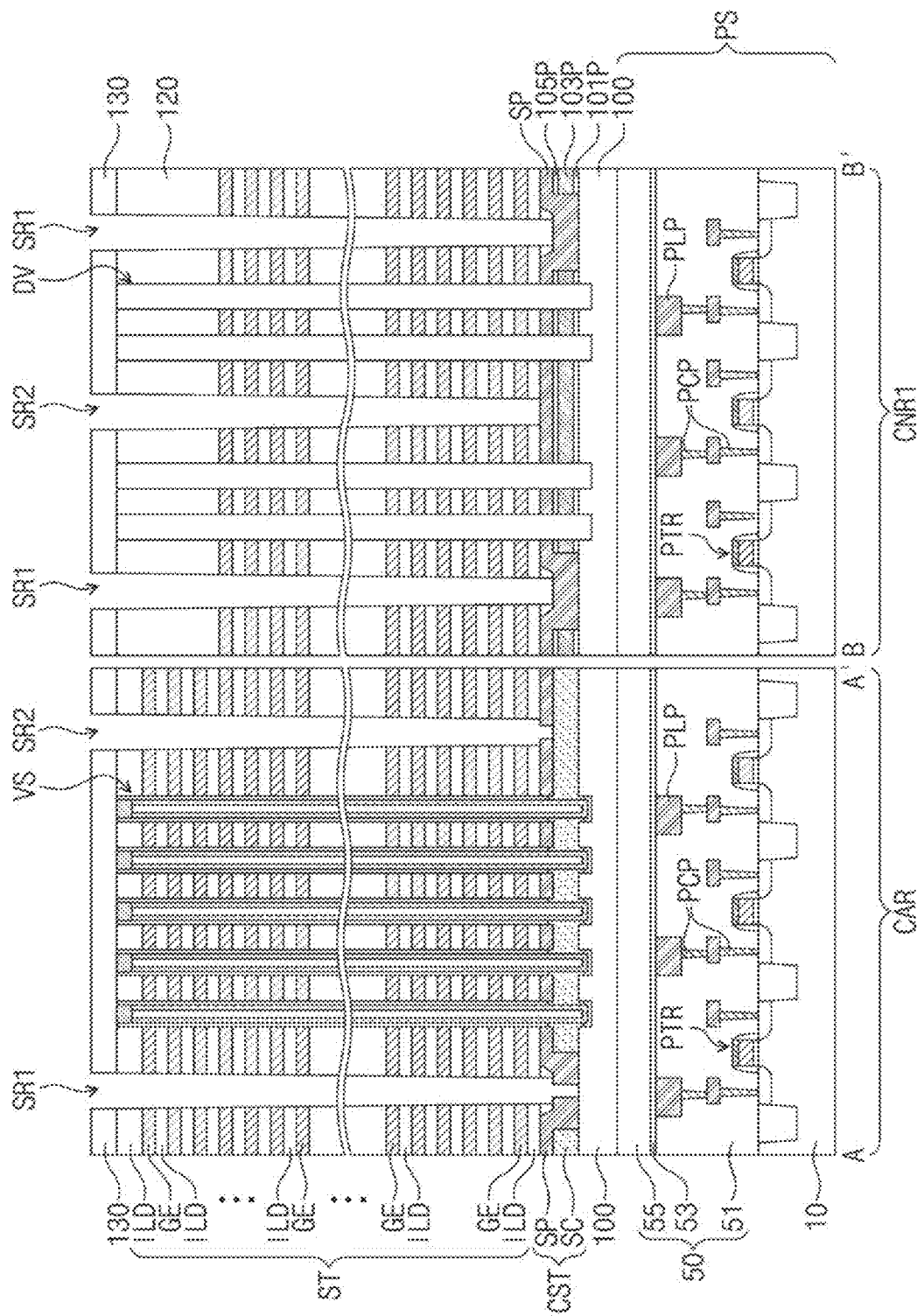

Referring to FIGS. 5, 15A, and 15B, an isotropic etching process may be performed to remove the sacrificial spacer 135, after the removal of the second mask pattern 133. Accordingly, the side surfaces of the sacrificial layer SL of the mold structure PST may be exposed again through the first and second separation trenches SR1 and SR2. The first and second separation trenches SR1 and SR2 may be formed on the first connection region CNR1 to expose the top surface of the conductive support layer SP.

Next, the stack ST may be formed by a process of replacing the sacrificial layers SL with the electrodes GE. The formation of the stack ST may include isotropically etching the sacrificial layers SL using an etch recipe having an etch selectivity with respect to the insulating layers ILD, the vertical structures VS, and the source structure CST. Portions of the sacrificial layers SL, which are isolated by the insulating dams DM1, DM2, DM3, and DM4, may be left to form the mold patterns MLP, during the isotropic etching process on the sacrificial layers SL.

Figure 16A:
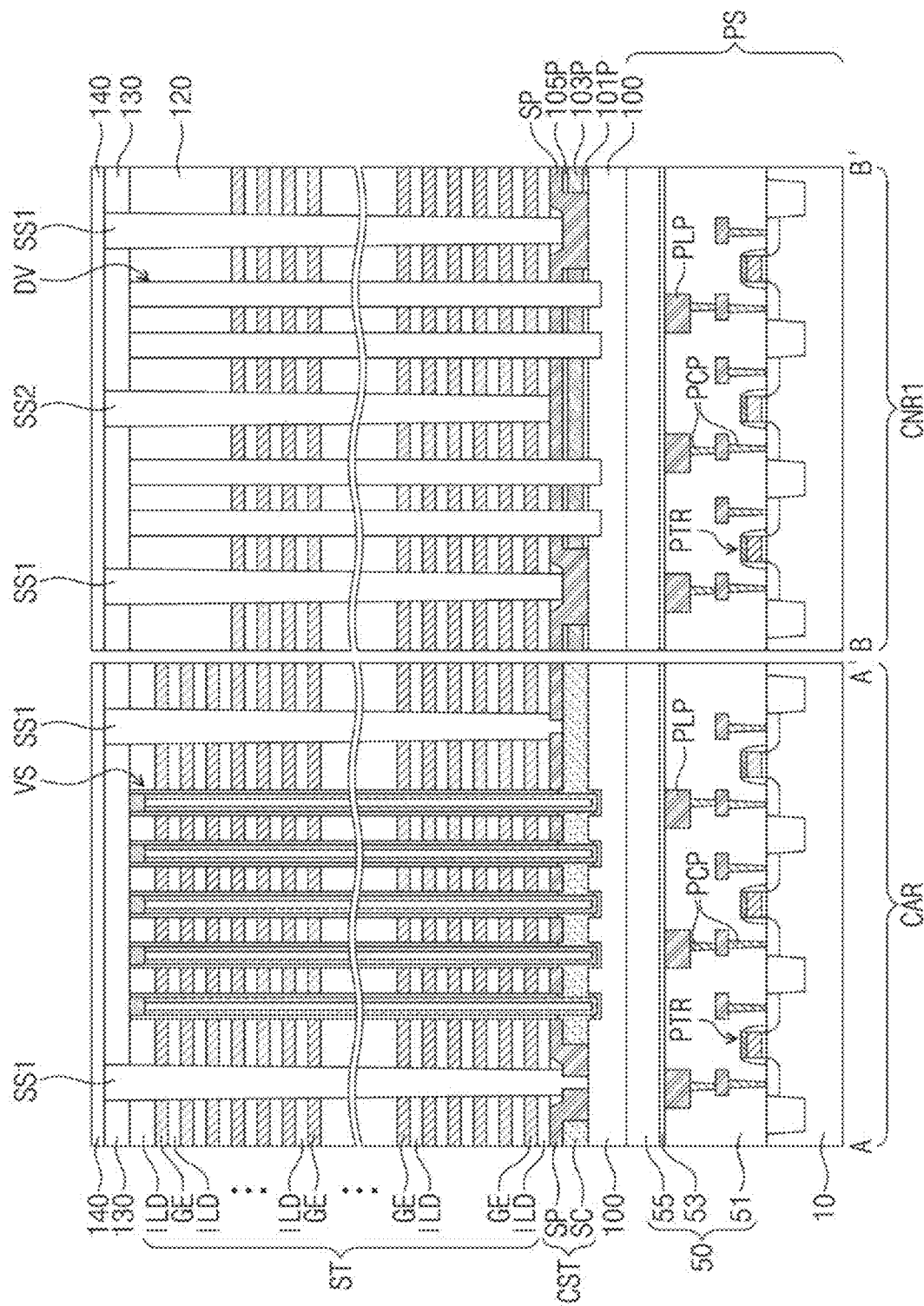
Figure 16B:
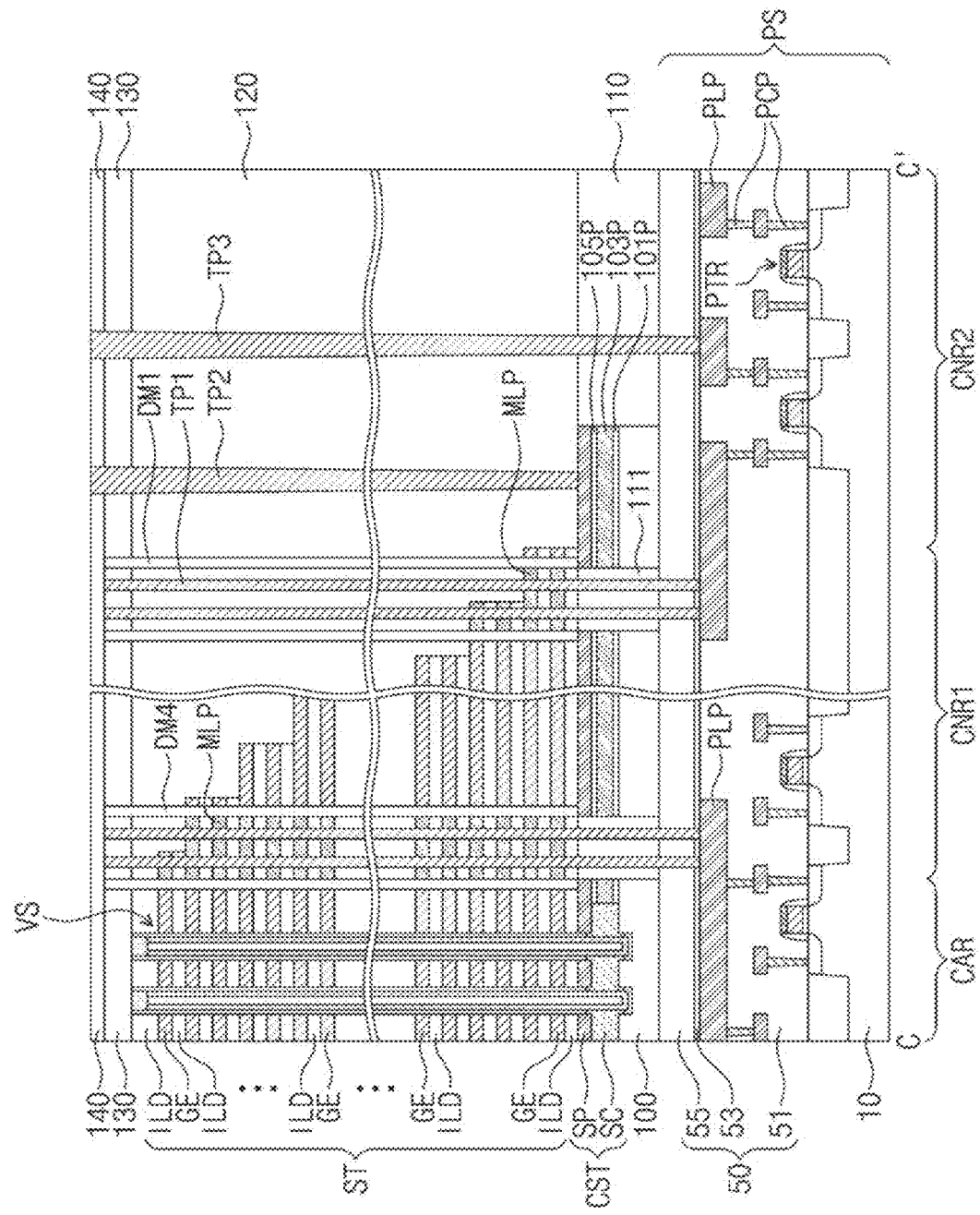

Referring to FIGS. 5, 16A, and 16B, the first and second separation structures SS1 and SS2 may be formed by filling the first and second separation trenches SR1 and SR2 with an insulating material, after the formation of the stack ST. The first and second separation structures SS1 and SS2 may have a single- or multi-layered structure. In some example embodiments, the first and second separation structures SS1 and SS2 may be formed of or include at least one of silicon oxide, silicon nitride, or poly silicon.

Next, the second interlayer insulating layer 140 may be formed on the first interlayer insulating layer 130. The cell contact plugs CPLG (e.g., see FIG. 5) connected to the electrodes GE of the stack ST may be formed. In addition, the third penetration plug TP3, which is connected to the peripheral circuit line PLP, and the second penetration plug TP2, which is connected to the source structure CST, may be formed.

Referring back to FIGS. 5, 6A, and 6B, the lower and upper contact plugs LCT and UCT, the bit line contact plugs BCTa and BCTb, and the connection conductive pattern ICT may be formed in the third and fourth interlayer insulating layers 150 and 160. The bit lines BL and the conductive lines CL may be formed on the fourth interlayer insulating layer 160.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

According to some example embodiments of the inventive concepts, it may be possible to prevent or reduce the occurrence of penetration plugs from being connected to gate electrodes.

While example embodiments of the inventive concepts have been particularly shown and described, it will be understood by one of ordinary skill in the art that variations in form and detail may be made therein without departing from the spirit and scope of the attached

What is claimed is:

1. A semiconductor device, comprising
   a peripheral circuit structure on a semiconductor substrate, the peripheral circuit structure including peripheral circuits and peripheral circuit lines;
   a semiconductor layer on the peripheral circuit structure, the semiconductor layer including a cell array region and a connection region;
   a stack including electrodes stacked on the semiconductor layer, and having a stepwise structure on the connection region;
   a planarization insulating layer covering the stack;
   vertical structures on the cell array region, penetrating the stack, each of which includes a data storage pattern;
   separation structures extending in a first direction and penetrating the stack;
   cell contact plugs on the connection region penetrating the planarization insulating layer, and connected to respective ones of the electrodes;
   a dam group including insulating dams on the connection region, penetrating the stack and arranged in the first direction; and
   penetration plugs, which penetrate the insulating dams and are connected to respective ones of the peripheral circuit lines,
   wherein the dam group includes a first insulating dam, which is farthest from the cell array region,
   the first insulating dam includes a first sidewall portion and a second sidewall portion, which are spaced apart from each other in the first direction, and
   a difference between an upper thickness and a lower thickness of the second sidewall portion of the first insulating dam is larger than a difference between an upper thickness and a lower thickness of the first sidewall portion.

2. The semiconductor device of claim 1, wherein the upper thickness of the second sidewall portion of the first insulating dam is larger than the upper thickness of the first sidewall portion of the first insulating dam.

3. The semiconductor device of claim 1, wherein
the first insulating dam further includes a third sidewall portion and a fourth sidewall portion connecting the first sidewall portion to the second sidewall portion, and
an upper thickness of the third sidewall portion and an upper thickness of the fourth sidewall portion are equal to the upper thickness of the second sidewall portion.

4. The semiconductor device of claim 1, wherein the difference between the upper thickness and the lower thickness of the second sidewall portion is about 1.1 to 1.5 times the difference between the upper thickness and the lower thickness of the first sidewall portion.

5. The semiconductor device of claim 1, wherein the lower thickness of the second sidewall portion is equal to the lower thickness of the first sidewall portion.

6. The semiconductor device of claim 1, wherein the dam group includes a plurality of dam groups in a second direction crossing the first direction.

7. The semiconductor device of claim 1, further comprising
mold patterns, which are in the insulating dam, and each of which is located at the same level as a corresponding one of the electrodes,
wherein the penetration plugs penetrate the mold patterns.

8. The semiconductor device of claim 1, wherein each of the insulating dams is connected to at least one of the electrodes.

9. The semiconductor device of claim 1, further comprising
a conductive support layer between the semiconductor layer and the stack,
wherein a lower portion of the first insulating dam is connected to the conductive support layer.

10. The semiconductor device of claim 1, wherein
the dam group further includes a second insulating dam spaced apart from the first insulating dam with the cell contact plugs interposed therebetween,
the second insulating dam includes a third sidewall portion and a fourth sidewall portion spaced apart from each other in the first direction, and
a difference between an upper thickness and a lower thickness of the fourth sidewall portion of the second insulating dam is equal to a difference between an upper thickness and a lower thickness of the third sidewall portion.

11. The semiconductor device of claim 10, wherein the difference between the upper thickness and the lower thickness of the second sidewall portion of the first insulating dam is larger than the difference between the upper thickness and the lower thickness of the fourth sidewall portion of the second insulating dam.

12. The semiconductor device of claim 10, wherein a number of the electrodes in contact with the first insulating dam is smaller than the number of the electrodes in contact with the second insulating dam.

13. The semiconductor device of claim 1, further comprising
an insulating penetration pattern penetrating the semiconductor layer,
wherein the penetration plugs penetrate the insulating penetration pattern.

14. The semiconductor device of claim 1, wherein at least one of the separation structures is spaced apart from the first insulating dam in the first direction.

15. A semiconductor device, comprising:
a peripheral circuit structure including peripheral circuits and peripheral circuit lines on a semiconductor substrate;
a semiconductor layer on the peripheral circuit structure, the semiconductor layer including a cell array region and a connection region;
a stack including electrodes stacked on the semiconductor layer, and having a stepwise structure on the connection region;
a planarization insulating layer covering the stack;
a source conductive pattern on the cell array region and between the substrate and the stack;
dummy structures on the connection region penetrating the stack;
a conductive support layer between the stack and the source conductive pattern;
vertical structures on the cell array region penetrating the stack, and each of which includes a data storage pattern;
separation structures extending in a first direction and penetrating the stack;
cell contact plugs on the connection region penetrating the planarization insulating layer and connected to respective ones of the electrodes;
a dam group including insulating dams arranged in the first direction on the connection region and penetrating the stack; and
penetration plugs penetrating the insulating dams and connected to the respective ones of peripheral circuit lines,
wherein the dam group includes a first insulating dam which is farthest from the cell array region,
the first insulating dam includes a first sidewall portion and a second sidewall portion spaced apart from each other in the first direction, and
a difference between an upper thickness and a lower thickness of the second sidewall portion of the first insulating dam is larger than a difference between an upper thickness and a lower thickness of the first sidewall portion.

16. The semiconductor device of claim 15, wherein the upper thickness of the second sidewall portion of the first insulating dam is larger than the upper thickness of the first sidewall portion of the first insulating dam.

17. The semiconductor device of claim 15, wherein the difference between the upper thickness and the lower thickness of the second sidewall portion is about 1.1 to 1.5 times the difference between the upper thickness and the lower thickness of the first sidewall portion.

18. The semiconductor device of claim 15, wherein a lower portion of the first insulating dam is connected to the conductive support layer.

19. The semiconductor device of claim 15, wherein the lower thickness of the second sidewall portion is equal to the lower thickness of the first sidewall portion.

20. An electronic system, comprising:
a semiconductor device including
a peripheral circuit structure including peripheral circuits and peripheral circuit lines on a semiconductor substrate,
a semiconductor layer on the peripheral circuit structure, the semiconductor layer including a cell array region and a connection region,
a stack including electrodes stacked on the semiconductor layer, and having a stepwise structure on the connection region, a planarization insulating layer covering the stack,
vertical structures on the cell array region penetrating the stack, each of which includes a data storage pattern, and separation structures extending in a first direction and penetrating the stack,
cell contact plugs on the connection region penetrating the planarization insulating layer and connected to respective ones of the electrodes,
a dam group including insulating dams arranged in the first direction on the connection region penetrating the stack, and
penetration plugs penetrating the insulating dams and connected to respective ones of the peripheral circuit lines; and
a controller electrically connected to the semiconductor device through an input/output pad to control the semiconductor device,
wherein the dam group includes a first insulating dam which is farthest from the cell array region,
the first insulating dam includes a first sidewall portion and a second sidewall portion spaced apart from each other in the first direction, and
a difference between an upper thickness and a lower thickness of the second sidewall portion of the first insulating dam is larger than a difference between an upper thickness and a lower thickness of the first sidewall portion.

* * * * *